US011977231B1

(12) United States Patent
Smyth et al.

(10) Patent No.: US 11,977,231 B1
(45) Date of Patent: May 7, 2024

(54) OPTICAL LENS ASSEMBLIES

(71) Applicant: META PLATFORMS TECHNOLOGIES, LLC, Menlo Park, CA (US)

(72) Inventors: Katherine Marie Smyth, Seattle, WA (US); John Cooke, Bothell, WA (US); Andrew John Ouderkirk, Kirkland, UT (US); Karol Constantine Hatzilias, Sammamish, WA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 119 days.

(21) Appl. No.: 17/546,886

(22) Filed: Dec. 9, 2021

Related U.S. Application Data

(63) Continuation of application No. 16/016,428, filed on Jun. 22, 2018, now Pat. No. 11,209,649.
(Continued)

(51) Int. Cl.
*G02B 27/01* (2006.01)
*C30B 29/16* (2006.01)
(Continued)

(52) U.S. Cl.
CPC .......... *G02B 27/0172* (2013.01); *C30B 29/16* (2013.01); *C30B 29/30* (2013.01);
(Continued)

(58) Field of Classification Search
CPC ...... G02B 27/0179; G02B 1/111; G02B 3/14; G02B 7/023; G02B 7/04; G02B 7/09;
(Continued)

(56) References Cited

U.S. PATENT DOCUMENTS 60,109 A 11/1866 Woodward
3,571,555 A 3/1971 Townes et al.
(Continued)

FOREIGN PATENT DOCUMENTS

JP 2002243918 A * 8/2002
KR 20110107812 A 10/2011
(Continued)

OTHER PUBLICATIONS

Ouderkirk A.J., et al., "Electroactive Polymer Devices and Nanovoided Polymer Materials and Methods and Systems fabrication Thereof," U.S. Appl. No. 16/106,945, filed Aug. 21, 2018, 98 pages.
(Continued)

*Primary Examiner* — William Choi
(74) *Attorney, Agent, or Firm* — Greenberg Traurig, LLP

(57) ABSTRACT

The disclosed optical lens assemblies may include a deformable optical element including a substantially transparent transducer configured to deform, and thus change at least one optical property of, the deformable optical element. At least a portion of the substantially transparent transducer may be positioned within a substantially transparent optical aperture of the optical lens assembly. Various head-mounted displays incorporating such an optical lens assembly, and methods of fabricating the same, are also disclosed.

20 Claims, 26 Drawing Sheets

Related U.S. Application Data

(60) Provisional application No. 62/646,900, filed on Mar. 22, 2018.

(51) Int. Cl.
*C30B 29/30* (2006.01)
*C30B 29/32* (2006.01)
*G02B 26/08* (2006.01)
*G02C 7/06* (2006.01)
*G02C 11/00* (2006.01)
*C30B 7/10* (2006.01)
*C30B 15/00* (2006.01)

(52) U.S. Cl.
CPC .......... *C30B 29/32* (2013.01); *G02B 26/0875* (2013.01); *G02B 27/0179* (2013.01); *G02C 7/06* (2013.01); *G02C 11/10* (2013.01); *C30B 7/10* (2013.01); *C30B 15/00* (2013.01); *G02B 2027/0123* (2013.01); *G02B 2027/0178* (2013.01); *G02B 2027/0187* (2013.01)

(58) Field of Classification Search
CPC .............. G02B 26/004; G02B 26/0875; G02B 27/0172; G02B 27/0176; G02B 2027/0123; G02B 2027/0152; G02B 2027/0159; G02B 2027/0178; G02B 2027/0185; G02B 2027/0187; B05D 1/005; B05D 3/12; B05D 5/061; C30B 29/16; C30B 29/30; C30B 29/32; C30B 7/10; C30B 15/00; B29D 11/00009; B29K 2075/00; G02C 7/06; G02C 7/085; G02C 11/10
USPC .......................... 359/630, 665–667; 345/7–9
See application file for complete search history.

(56) References Cited

U.S. PATENT DOCUMENTS

| | | | |
|---|---|---|---|
| 3,797,922 | A | 3/1974 | Plummer |
| 4,477,158 | A | 10/1984 | Pollock et al. |
| 5,154,862 | A | 10/1992 | Reagan et al. |
| 5,225,244 | A | 7/1993 | Aharoni et al. |
| 5,663,779 | A | 9/1997 | Karasawa |
| 5,956,183 | A | 9/1999 | Epstein et al. |
| 6,081,388 | A | 6/2000 | Widl |
| 6,420,441 | B1 | 7/2002 | Allen et al. |
| 6,747,806 | B2 * | 6/2004 | Gelbart ................... G02B 3/14 359/666 |
| 6,918,670 | B2 | 7/2005 | Blum et al. |
| 7,008,054 | B1 | 3/2006 | Kurtin et al. |
| 7,118,219 | B2 | 10/2006 | Itagaki |
| 7,125,508 | B2 | 10/2006 | Ide et al. |
| 7,864,440 | B2 | 1/2011 | Berge |
| 7,866,816 | B2 | 1/2011 | Kurtin |
| 8,210,678 | B1 | 7/2012 | Farwig |
| 8,441,737 | B2 | 5/2013 | Buch et al. |
| 9,292,085 | B2 | 3/2016 | Bennett et al. |
| 10,187,568 | B1 | 1/2019 | Tran et al. |
| 10,409,089 | B2 | 9/2019 | Pugh et al. |
| 10,698,224 | B1 | 6/2020 | Cooke et al. |
| 10,754,145 | B1 | 8/2020 | Ouderkirk et al. |
| 10,881,287 | B1 | 1/2021 | Ouderkirk et al. |
| 10,928,558 | B1 | 2/2021 | Cooke et al. |
| 10,928,656 | B1 | 2/2021 | Smyth et al. |
| 10,962,791 | B1 | 3/2021 | Ouderkirk et al. |
| 11,011,739 | B1 | 5/2021 | Ouderkirk et al. |
| 11,048,075 | B1 | 6/2021 | Ouderkirk |
| 2003/0003295 | A1 | 1/2003 | Dreher et al. |
| 2003/0054115 | A1 | 3/2003 | Albano et al. |
| 2003/0067245 | A1 | 4/2003 | Pelrine et al. |
| 2003/0083433 | A1 | 5/2003 | James et al. |
| 2003/0128496 | A1 | 7/2003 | Allen et al. |
| 2004/0096672 | A1 | 5/2004 | Lukas et al. |
| 2006/0024976 | A1 | 2/2006 | Waldfried et al. |
| 2006/0073424 | A1 | 4/2006 | Koveshnikov et al. |
| 2006/0228092 | A1 | 10/2006 | Hebrink et al. |
| 2006/0247404 | A1 | 11/2006 | Todd |
| 2007/0035839 | A1 | 2/2007 | Ibuki |
| 2008/0038561 | A1 | 2/2008 | Yoshizawa et al. |
| 2008/0049431 | A1 | 2/2008 | Boek et al. |
| 2008/0084532 | A1 | 4/2008 | Kurtin |
| 2008/0088793 | A1 | 4/2008 | Sverdrup et al. |
| 2008/0123049 | A1 | 5/2008 | Volk |
| 2008/0144185 | A1 | 6/2008 | Wang et al. |
| 2008/0170299 | A1 | 7/2008 | Kawabata |
| 2008/0171431 | A1 | 7/2008 | Yu et al. |
| 2008/0290435 | A1 | 11/2008 | Oliver et al. |
| 2008/0291394 | A1 | 11/2008 | Ishak |
| 2009/0015786 | A1 | 1/2009 | Harris |
| 2009/0027778 | A1 | 1/2009 | Wu et al. |
| 2009/0096106 | A1 | 4/2009 | Vrtis et al. |
| 2009/0289529 | A1 | 11/2009 | Ito et al. |
| 2009/0304924 | A1 | 12/2009 | Gadgil |
| 2010/0075056 | A1 | 3/2010 | Axisa et al. |
| 2010/0109486 | A1 | 5/2010 | Polyakov et al. |
| 2010/0168409 | A1 | 7/2010 | Fujita |
| 2010/0202054 | A1 | 8/2010 | Niederer |
| 2010/0238400 | A1 | 9/2010 | Volk |
| 2011/0075096 | A1 | 3/2011 | Ishak et al. |
| 2011/0085131 | A1 | 4/2011 | Gupta et al. |
| 2011/0096411 | A1 | 4/2011 | Henriksen et al. |
| 2011/0149410 | A1 | 6/2011 | Blum |
| 2011/0176105 | A1 | 7/2011 | Harris |
| 2011/0179861 | A1 | 7/2011 | Grange et al. |
| 2011/0235326 | A1 | 9/2011 | Yeh et al. |
| 2011/0294305 | A1 | 12/2011 | Jacobs et al. |
| 2012/0029416 | A1 | 2/2012 | Parker et al. |
| 2012/0032559 | A1 | 2/2012 | Hino et al. |
| 2012/0041553 | A1 | 2/2012 | Gupta et al. |
| 2012/0044571 | A1 | 2/2012 | Mukawa |
| 2012/0063000 | A1 | 3/2012 | Batchko et al. |
| 2012/0087015 | A1 | 4/2012 | Nibauer et al. |
| 2012/0092775 | A1 | 4/2012 | Duston et al. |
| 2012/0170920 | A1 | 7/2012 | Moreau et al. |
| 2012/0229754 | A1 | 9/2012 | Iyer et al. |
| 2012/0250151 | A1 | 10/2012 | Lee et al. |
| 2012/0287512 | A1 | 11/2012 | Egan et al. |
| 2013/0171546 | A1 | 7/2013 | White et al. |
| 2013/0176628 | A1 | 7/2013 | Batchko et al. |
| 2013/0300635 | A1 | 11/2013 | White et al. |
| 2014/0009039 | A1 | 1/2014 | Jenninger et al. |
| 2014/0078586 | A1 | 3/2014 | Spurgeon et al. |
| 2014/0153102 | A1 | 6/2014 | Chang |
| 2014/0186215 | A1 | 7/2014 | Shinta et al. |
| 2014/0227548 | A1 | 8/2014 | Myrick |
| 2014/0300857 | A1 | 10/2014 | Cohen-Tannoudji et al. |
| 2014/0312737 | A1 | 10/2014 | Jenninger et al. |
| 2015/0062719 | A1 | 3/2015 | Kyung et al. |
| 2015/0116656 | A1 | 4/2015 | Stevens et al. |
| 2015/0138110 | A1 | 5/2015 | Yairi et al. |
| 2015/0146161 | A1 | 5/2015 | Rigato et al. |
| 2015/0302990 | A1 | 10/2015 | Ghosh et al. |
| 2015/0323812 | A1 | 11/2015 | Ishak et al. |
| 2016/0004099 | A1 | 1/2016 | Stevens et al. |
| 2016/0091635 | A1 | 3/2016 | Ibuki et al. |
| 2016/0187985 | A1 | 6/2016 | Lim et al. |
| 2017/0021385 | A1 | 1/2017 | Smith et al. |
| 2017/0045649 | A1 | 2/2017 | Bolis |
| 2017/0160600 | A1 | 6/2017 | Galstian et al. |
| 2017/0177106 | A1 | 6/2017 | Kihara |
| 2017/0184848 | A1 | 6/2017 | Vallius |
| 2017/0188021 | A1 | 6/2017 | Lo et al. |
| 2017/0192595 | A1 | 7/2017 | Choi et al. |
| 2017/0261653 | A1 | 9/2017 | Peyman |
| 2017/0299956 | A1 | 10/2017 | Holland et al. |
| 2017/0317269 | A1 | 11/2017 | Zhang et al. |
| 2017/0336641 | A1 | 11/2017 | Von Und Zu Liechtenstein |
| 2018/0255250 | A1 | 9/2018 | Price et al. |
| 2018/0275394 | A1 | 9/2018 | Yeoh et al. |
| 2018/0335649 | A1 | 11/2018 | Tsai |
| 2019/0173128 | A1 | 6/2019 | Visco et al. |

(56) References Cited

U.S. PATENT DOCUMENTS

| | | |
|---|---|---|
| 2019/0243123 A1 | 8/2019 | Bohn |
| 2019/0296218 A1 | 9/2019 | Ouderkirk et al. |
| 2019/0302479 A1 | 10/2019 | Smyth et al. |
| 2020/0166742 A1 | 5/2020 | Peyman |
| 2020/0251709 A1 | 8/2020 | Lee et al. |

FOREIGN PATENT DOCUMENTS

| | | |
|---|---|---|
| KR | 101675093 B1 | 11/2016 |
| WO | 2008156166 A1 | 12/2008 |
| WO | 2010078666 A1 | 7/2010 |
| WO | 2010104904 A2 | 9/2010 |
| WO | 2019183431 A1 | 9/2019 |
| WO | 2019190887 A1 | 10/2019 |

OTHER PUBLICATIONS

Ouderkirk A.J., et al., "Electroactive Polymer Devices, Systems, and Methods," U.S. Appl. No. 16/035,562, filed Jul. 13, 2018, 55 Pages.

Ouderkirk A.J., et al., "Electroactive Polymer Devices, Systems, and Methods," U.S. Appl. No. 16/059,091, filed Aug. 9, 2018, 68 Pages.

Ouderkirk A.J., et al., "Multi-Element Prescription Lenses With Eye-Tracking," for U.S. Appl. No. 16/041,634, filed Jul. 20, 2018, 87 Pages.

Ouderkirk A.J., et al., "Nanovoided Electroactive Polymer Devices, Systems, and Methods," U.S. Appl. No. 16/041,858, filed Jul. 23, 2018, 65 Pages.

Ouderkirk A.J., et al., "Optical Lens Assemblies and Related Methods," U.S. Appl. No. 16/018,752, filed Jun. 26, 2018, 35 pages.

Ouderkirk A.L., et al., "Optical Devices, Systems, and Methods of Manufacturing," U.S. Appl. No. 62/646,900, filed Mar. 22, 2018, 13 pages.

Ouderkirk A.L., et al., "Optical Devices, Systems, and Methods of Manufacturing," U.S. Appl. No. 62/650,254, filed Mar. 29, 2018, 9 pages.

Patra G.D., et al., "Comparison on Optical Properties of Pure and Doped Lithium Tetraborate Single Crystals and Glasses," Solid State Physics: Proceedings of the 56th DAE Solid State Physics Symposium 2011, AIP Conference Proceedings 1447, Dec. 11, 2012, pp. 1335-1346.

"Piezoelectric Materials, New Materials, Piezo Theory," APC International, Ltd., Retrieved on Mar. 15, 2018, 1 page, Retrieved from the Internet: URL: https://www.americanpiezo.com/knowledge-center/piezo-theory/new-materials.html.

Preinterview Final Office Action dated Feb. 1, 2021 for U.S. Appl. No. 16/021,650, filed Jun. 28, 2018, 47 Pages.

Preinterview First Office Action dated Aug. 4, 2020 for U.S. Appl. No. 16/021,580, filed Jun. 28, 2018, 48 Pages.

Preinterview First Office Action dated Jul. 14, 2020 for U.S. Appl. No. 16/018,746, filed Jun. 26, 2018, 20 Pages.

Preinterview First Office Action dated Dec. 16, 2019 for U.S. Appl. No. 16/018,752, filed Jun. 26, 2018, 19 Pages.

Preinterview First Office Action dated Sep. 27, 2019 for U.S. Appl. No. 15/992,731, filed May 30, 2018, 17 Pages.

Riegler B., et al., "Index Matching Silicone for High Brightness LED Packaging," IMAPS International Conference on Device Packaging, Mar. 13-16, Scottsdale, AZ., Mar. 18, 2005, 17 Pages.

Shian S., et al., "Tunable Lenses using Transparent Dielectric Elastomer Actuators," School of Engineering and Applied Sciences, Harvard University, Cambridge, Masschusetts 02138, USA, Optics Express, Mar. 26, 2013, vol. 21 (7), 8 pages.

Smyth K.M., et al., "Optical Lens Assemblies and Related Methods," U.S. Appl. No. 16/018,746, filed Jun. 26, 2018, 45 pages.

Smyth K.M., et al., "Optical Lens Assemblies, Head-Mounted Displays, and Related Methods," U.S. Appl. No. 16/016,428, filed Jun. 22, 2018, 78 pages.

Smyth K.M., et al., "Optical Lens Assemblies, Head-Mounted Displays, and Related Methods," U.S. Appl. No. 16/021,650, filed Jun. 28, 2018, 52 pages.

Smyth K.M., et al., "Systems and Methods for Actuation of Asymmetric Optical Elements," U.S. Appl. No. 15/992,731, filed May 30, 2018, 65 pages.

Wang Y., et al., "A Highly Stretchable, Transparent, and Conductive Polymer," Science Advances, Mar. 10, 2017, vol. 3 (3), Article e1602076, pp. 1-10.

Zhao P., et al., "Spherical Aberration Free Liquid-Filled Tunable Lens with Variable Thickness Membrane," Optics Express, Aug. 5, 2015, vol. 23 (16), pp. 21264-21278, Retrieved from the Internet: URL: https://doi.org/10.1364/0.23.021264.

"Adaptive Glasses," Press Kit Home, Retrieved on Mar. 13, 2018, 5 pages, Retrieved from the Internet: URL: http://tvc.utah.edu/ces/press-kit.php.

"Adjustable Lens Glasses: How They Work," UZOOM Adlens, Retrieved on Mar. 28, 2018, 9 pages, Retrieved from the Internet: URL: https://adlens.com/how-it-works/.

"Adjustable Reading Glasses," Retrieved on May 7, 2018, 1 page, Retrieved from internet URL: https://adlens.com/?gclid=EAlalQobChMljOjcsLj02gIVklqGCh2GMAsiEAAYAS AAEgL . . . .

Billah M., et al., "Microstructure Evolution and Electrical Characterization of Lanthanum Doped Barium Titanate (BaTiO3) Ceramics," International Conference on Mechanical Engineering, AIP Conference Proceedings 1754, Jul. 12, 2016, Article 030006, pp. 1-7.

Cao W., et al., "Grain Size and Domain Size Relations in Bulk Ceramic Ferroelectric Materials," Journal of Physics and Chemistry of Solids, Oct. 1996, vol. 57 (10), pp. 1499-1505.

Communication pursuant to Article 94(3) EPC for European Patent Application No. 19715707.6, dated Mar. 22, 2021, 5 pages.

Cooke J.M., et al., "Optical Lens Assemblies, Head-Mounted Displays, and Methods of Altering Optical Properties of Optical Lens Assemblies," U.S. Appl. No. 16/013,837, filed Jun. 20, 2018, 67 pages.

Cooke J.M., et al., "Optical Lens Assemblies, Head-Mounted Displays, and Related Methods," U.S. Appl. No. 16/021,580, filed Jun. 28, 2018, 49 pages.

Ding Z., et al., "Surface Profiling of an Aspherical Liquid Lens with a Varied Thickness Membrane," Optics Express, Feb. 20, 2017, vol. 25 (4), pp. 3122-3132.

"Displacement Modes of Piezoelectric Actuators," Piezo Technology, Retrieved on Mar. 14, 2018, 12 pages, Retrieved from the Internet: URL: https://www.piceramic.com/enpiezo-technology/properties-piezo-actuators/displacement-modes/.

Examiner-Initiated Interview Summary dated Apr. 20, 2020 for U.S. Appl. No. 16/008,635, filed Jun. 14, 2018, 3 pages.

Final Office Action dated Jun. 2, 2020 for U.S. Appl. No. 15/992,731, filed May 30, 2018, 25 Pages.

Final Office Action dated Sep. 21, 2020 for U.S. Appl. No. 16/059,091, filed Aug. 9, 2018, 18 Pages.

Final Office Action dated Nov. 24, 2020 for U.S. Appl. No. 16/106,945, filed Aug. 21, 2018, 94 Pages.

Final Office Action dated Nov. 30, 2020 for U.S. Appl. No. 16/018,752, filed Jun. 26, 2018, 41 Pages.

"Focus Tunable Lenses," Optotune, Mar. 13, 2018, 2 Pages, Retrieved from the Internet: URL: http://www.optotune.com/technology/focus-tunable-lenses.

Guha I.F., et al., "Creating Nanoscale Emulsions Using Condensation," Nature Communications, Published: Nov. 8, 2017, vol. 8, Article 1371, pp. 1-7.

Gurvich M.R., "On Characterization of Anisotropic Elastomeric Materials for Structural Analysis," Rubber Chemistry and Technology, Mar. 2004, vol. 76 (1), pp. 115-130.

He C., et al., "Linear Electro-Optic Properties of Orthorhombic PZN-8%PT Single Crystal," IEEE Transactions on Ultrasonics, Ferroelectrics, and Frequency Control, Jun. 1, 2011, vol. 58 (6), pp. 1118-1121.

"Highly Reliable Multilayer Piezo Actuators," Piezo Technology, Retrieved on Mar. 14, 2018, 8 pages. Retrieved from the Internet: URL: https://www.piceramic.com/en/piezo-technology/picma/.

(56) References Cited

OTHER PUBLICATIONS

Hocking L.M., "The Effect of Slip on the Motion of a Sphere Close to a Wall and of Two Adjacent Spheres," Journal of Engineering Mathamatics, 1973, vol. 7 (3), pp. 207-221.
"How Does it Work," POLIGHT, Retrieved on Mar. 13, 2018, 3 pages, Retrieved from the Internet: URL: http://www.polight.com/technology-and-products/how-does-it-work/default.aspx.
International Preliminary Report on Patentability for International Application No. PCT/US2019/023484, dated Oct. 1, 2020, 8 pages.
International Preliminary Report on Patentability for International Application No. PCT/US2019/023485, dated Oct. 8, 2020, 8 Pages.
International Search Report and Written Opinion for International Application No. PCT/US2019/023484, dated Jul. 3, 2019, 9 pages.
International Search Report and Written Opinion for International Application No. PCT/US2019/023485, dated Jul. 4, 2019, 11 Pages.
Jiang H., et al., "Transparent Electro-Optic Ceramics and Devices," Optoelectronic Devices and Integration, Proceedings of Society of Photo-Optical Instrumentation Engineers (SPIE), Jan. 17, 2005, vol. 5644, pp. 380-394, Retrieved from the Internet: URL: https://doi.org/10.1117/12.582105.
Keplinger C., et al., "Stretchable, Transparent, Ionic Conductors," Science Magazine, Aug. 30, 2013, vol. 341, pp. 984-987.
Knapp K., et al., "Understanding Zirconia Crown Esthetics and Optical Properties," Retrieved on Jun. 12, 2018, vol. 2 (4), 17 pages, Retrieved from the Internet: URL: http://glidewelldental.com/education/inclusive-dental-implant-magazine-volume-2-issue-4/.
Kong L.B., et al., "Chapter 2: Transparent Ceramic Materials," Topics in Mining, Metallurgy, and Materials Engineering, 2015, pp. 29-91.
Merriam-Webster., "Porosity," Dictionary, Retrieved on Apr. 8, 2020, pp. 1-8, Retrieved on the Internet: URL: https://www.merriam-webster.com/dictionary/porosity.
Non-Final Office Action dated Apr. 8, 2020 for U.S. Appl. No. 16/059,091, filed Aug. 9, 2018, 54 Pages.
Non-Final Office Action dated Jun. 10, 2021 for U.S. Appl. No. 16/035,562, filed Jul. 13, 2018, 36 Pages.
Non-Final Office Action dated Mar. 12, 2021 for U.S. Appl. No. 16/016,428, filed Jun. 22, 2018, 56 Pages.
Non-Final Office Action dated Apr. 16, 2020 for U.S. Appl. No. 16/106,945, filed Aug. 21, 2018, 59 Pages.
Non-Final Office Action dated Jun. 16, 2021 for U.S. Appl. No. 16/016,428, filed Jun. 22, 2018, 43 Pages.
Non-Final Office Action dated Jan. 23, 2020 for U.S. Appl. No. 16/013,837, filed Jun. 20, 2018, 22 Pages.
Non-Final Office Action dated Aug. 24, 2020 for U.S. Appl. No. 15/992,731, filed May 30, 2018, 27 Pages.
Non-Final Office Action dated Jul. 30, 2020 for U.S. Appl. No. 16/041,634, filed Jul. 20, 2018, 24 Pages.
Non-Final Office Action dated Mar. 30, 2021 for U.S. Appl. No. 16/106,945, filed Aug. 21, 2018, 111 Pages.
Notice of Allowance dated Nov. 3, 2020 for U.S. Appl. No. 16/018,746, filed Jun. 26, 2018, 39 Pages.
Notice of Allowance dated May 4, 2020 for U.S. Appl. No. 16/008,635, filed Jun. 14, 2018, 32 Pages.
Notice of Allowance dated Dec. 9, 2020 for U.S. Appl. No. 16/021,580, filed Jun. 28, 2018, 68 Pages.
Notice of Allowance dated Mar. 10, 2021 for U.S. Appl. No. 16/018,752, filed Jun. 26, 2018, 32 Pages.
Notice of Allowance dated Apr. 14, 2020 for U.S. Appl. No. 16/013,837, filed Jun. 20, 2018, 14 Pages.
Notice of Allowance dated Oct. 16, 2020 for U.S. Appl. No. 15/972,794, filed May 7, 2018, 22 Pages.
Notice of Allowance dated Sep. 17, 2020 for U.S. Appl. No. 16/018,746, filed Jun. 26, 2018, 24 pages.
Notice of Allowance dated Nov. 18, 2020 for U.S. Appl. No. 15/992,731, filed May 30, 2018, 37 Pages.
Notice of Allowance dated Aug. 28, 2020 for U.S. Appl. No. 16/041,634, filed Jul. 20, 2018, 31 Pages.
Ouderkirk A.J., et al., "Apparatuses, Systems, and Methods for Adjusting Fluid Lenses," U.S. Appl. No. 16/008,635, filed Jun. 14, 2018, 41 Pages.

* cited by examiner

OPTICAL LENS ASSEMBLIES

CROSS REFERENCE TO RELATED APPLICATION

This application is a continuation of U.S. Non-Provisional patent application Ser. No. 16/016,428, filed Jun. 22, 2018, which claims the benefit of U.S. Provisional Patent Application No. 62/646,900, filed Mar. 22, 2018, the entire disclosure of each of which is incorporated herein by this reference.

BACKGROUND

Adjustable-lens systems may be useful in a variety of devices, including eyeglasses, cameras, and virtual or augmented reality ("VR/AR") systems. As accommodative elements, liquid lenses are varifocal, have high transmissivity, and, with proper optical design, can achieve low off-axis aberration and distortion for high image quality over a range of optical powers. However, for the wide field of view necessary for a realistic VR/AR experience, liquid lens weight and thickness can limit practical implementation. This poses a similar problem for liquid lens applications beyond VR/AR (including other wearable or so-called "Internet of Things" ("IoT") products) that require a large optical aperture for varifocal imaging.

In addition, conventional approaches for actuation of adjustable lenses involve edge-mounting an electromotive actuator or transmission element with a temple arm-mounted electromagnetic motor. Although feasible, such solutions often add significant weight and bulk to the accommodation system and the overall head-mounted display ("HMD").

SUMMARY

As will be described in greater detail below, the instant disclosure describes optical lens assemblies that include a deformable optical element including a substantially transparent transducer configured to deform, and thus change at least one optical property of, the deformable optical element. At least a portion of the substantially transparent transducer may be positioned within a substantially transparent optical aperture of the optical lens assembly.

In some examples, the substantially transparent optical aperture may allow the passage of light to a user's eye. In addition, at least one of the optical lens assembly or the deformable optical element may have a non-symmetric shape. The substantially transparent transducer may include an electroactive material and/or an electromechanical element. In some embodiments, the electroactive material may include a piezoelectric or electrostrictor ceramic and/or an electroactive polymer. The electroactive material may include a polycrystalline ceramic material, which may include a dopant. The electroactive material may have a perovskite-type crystallography. The electroactive polymer may include a piezoelectric polymer, an electrostrictor polymer, a dielectric elastomer, and/or an ionic polymer conductor. In addition, the piezoelectric polymer may include polyvinylidene fluoride and/or a copolymer of polyvinylidene fluoride. In some embodiments, the electroactive material may include a single-crystal material, such as $K_{0.5}Na_{0.5}NbO_3$, barium titanate, lithium niobate, lithium tetraborate, quartz, $Pb(Mg_{1/3}Nb_{2/3})O_3$—$PbTiO_3$, and/or $Pb(Zn_{1/3}Nb_{2/3})O_3$—$PbTiO_3$. The substantially transparent transducer may further include at least one substantially transparent electrode configured to activate the electroactive material by application of an electrical voltage thereto.

In some examples, the substantially transparent transducer may include a first surface and an opposing second surface, and at least one first electrode coupled to the first surface and at least one second electrode coupled to the second surface. One or more of the first electrode and the second electrode may include a transparent conducting oxide, indium tin oxide, a nanocomposite material, carbon nanotubes, silver nanowires, and/or graphene. A driving circuit may be electrically coupled to the first electrode and the second electrode.

The substantially transparent transducer may include a material having an elastic modulus greater than approximately 5 GPa, for example. The optical lens assembly may also include a structural support element supporting the deformable optical element. In some examples, the structural support element may include a substantially zero optical power lens, or a substantially non-zero optical power lens. The structural support element may also include an eye-tracking element that facilitates tracking a user's eye. Such an eye-tracking element may include a selective-transmission element that transmits light having a selected property and that does not transmit light that does not have the selected property.

In some examples, the optical property may include an accommodative optical property and/or an adaptive optical property. The deformable optical element may also include a deformable medium including a liquid, a gas, a gel, a foam, and/or a polymer. The deformable medium may be contained within the optical lens assembly by a rigid seal, a semi-rigid seal, a flexible seal, and/or a frame of the optical lens assembly. In some embodiments, the deformable medium may be formed of a material that does not require an edge seal.

In some examples, the substantially transparent transducer may include at least two (and sometimes more) electroactive materials. A driving circuit may include a series driving circuit or a parallel driving circuit electrically coupled to the at least two electroactive materials. In addition, the substantially transparent transducer may include at least one electroactive material coupled to at least one electrically passive support material. Such an electrically passive support material may have a higher mechanical stiffness than the electroactive material.

In some embodiments, the present disclosure also describes head-mounted displays including a display element and an optical lens assembly. In these embodiments, the optical lens assembly, when the head-mounted display is worn by a user, may be positioned between the display element and an eye of the user. The optical lens assembly may include at least one deformable optical element that includes at least one substantially transparent transducer positioned at least partially within a substantially transparent optical aperture of the optical lens assembly. The substantially transparent transducer may be configured to deform, and thus change at least one optical property of, the deformable optical element.

In some examples, the head-mounted displays may also include an additional optical lens assembly positioned adjacent to the display element on a side opposite the optical lens assembly. The additional optical lens assembly may include an additional deformable optical element. The deformable optical element and the additional deformable optical element may be configured to be simultaneously deformed upon actuation.

In some embodiments, the present disclosure also describes methods of fabricating optical lens assemblies. In accordance with such methods, a deformable optical element may be formed, including a substantially transparent transducer. At least a portion of the substantially transparent transducer may be positioned within a transparent optical aperture of the optical lens assembly. The substantially transparent transducer may be configured to deform, and thus change at least one optical property of, the deformable optical element.

In some examples, forming the substantially transparent transducer may include extruding a billet of at least one electroactive polymer material to thin the electroactive material, and prior to or after the extrusion, coupling a conductive electrode material to the electroactive polymer material. Forming the substantially transparent transducer may additionally or alternatively include growing a single-crystal material, cutting the single-crystal material at a predetermined angle relative to a crystalline structure thereof, thinning the cut single-crystal material, and forming a transparent, electrically conductive material over the thinned single-crystal material.

In some examples, the methods may also include forming at least a portion of at least one layer within the substantially transparent transducer via chemical vapor deposition, physical vapor deposition, transfer processing, and/or solvent evaporation. The methods may include hot-pressing a powdered ceramic material without a dopant or hot-pressing a powdered ceramic material with a dopant. A powdered ceramic material may be formed, and a green body may be formed prior to hot-pressing the powdered ceramic material. The methods may also include electrically coupling a driving circuit to the substantially transparent transducer.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of example embodiments and are a part of the specification. Together with the following description, these drawings demonstrate and explain various principles of the present disclosure.

Figure 1:
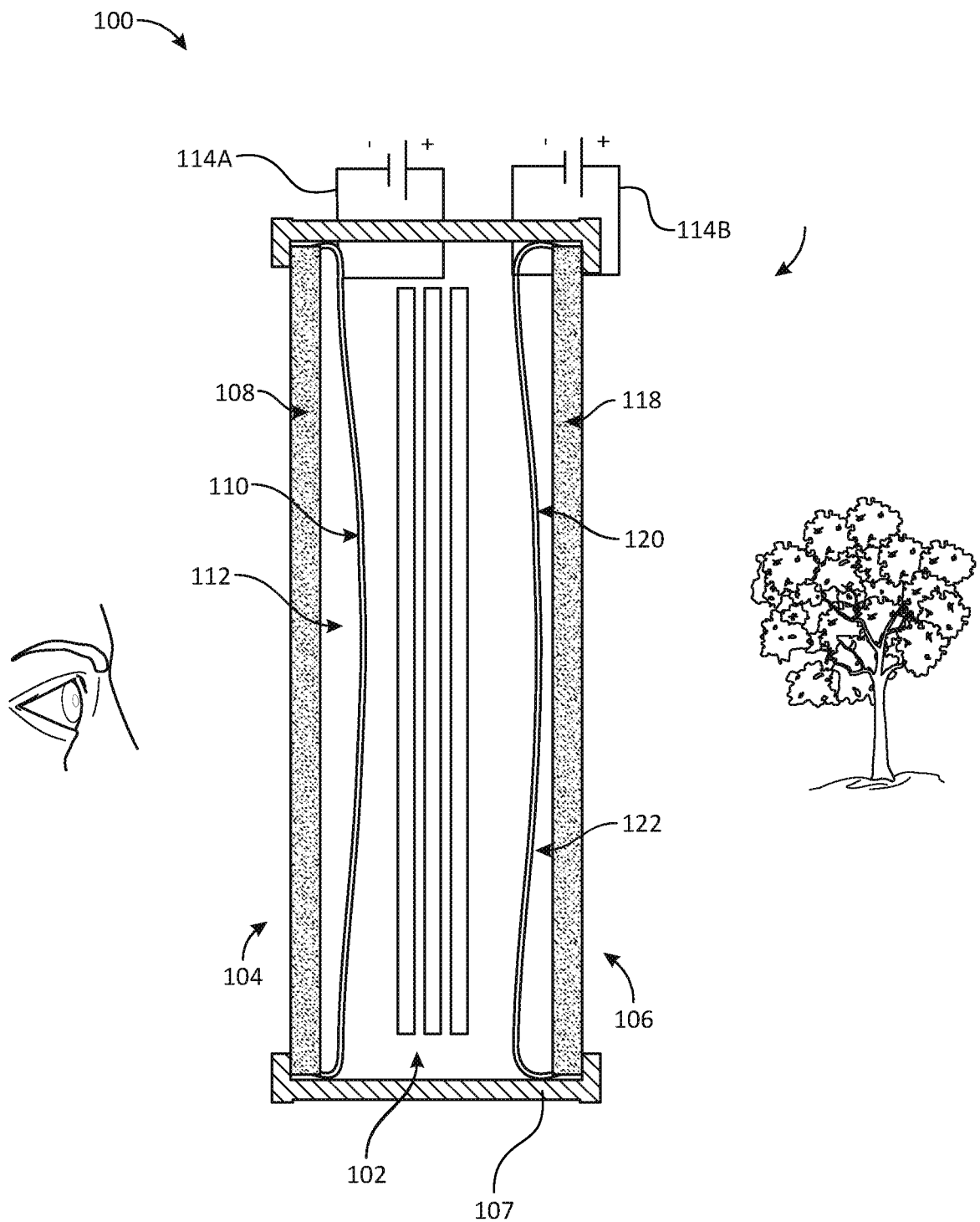
FIGS. 1 and 2 are cross-sectional views of optical lens assemblies according to embodiments of this disclosure.

Throughout the drawings, identical reference characters and descriptions may indicate similar, but not necessarily identical, elements. While the example embodiments described herein are susceptible to various modifications and alternative forms, specific embodiments have been shown by way of example in the drawings and will be described in detail herein. However, the example embodiments described herein are not intended to be limited to the particular forms disclosed. Rather, the present disclosure covers all modifications, equivalents, and alternatives falling within the scope of the appended claims.

DETAILED DESCRIPTION

The present disclosure is generally directed to adjustable optical lens assemblies having a deformable optical element that includes a substantially transparent transducer positioned at least partially within an optical aperture of the optical lens assembly. Positioning a substantially transparent transducer within the optical aperture may, in some examples, reduce the size and/or weight of an assembly's transduction elements and/or improve control of transduction and lens adjustments compared to conventional techniques, while maintaining visibility through the optical aperture. Edge-mounted electromechanical actuators in such assemblies may, in some embodiments, be absent, enabling a reduction in volume within a frame or support element adjacent to the optical aperture of the lens. Substantially transparent transducers may also improve and increase design options for managing actuation force and displacement since actuation may take place across an area of the deformable optical element, rather than solely along a peripheral edge.

In some embodiments, the substantially transparent transducer may include an electroactive material that is deformable upon application of a sufficient electrical voltage to alter at least one optical property of the optical lens assembly. The substantially transparent transducer may include a single electroactive material, a stack including an electroactive material and at least one passive material, a stack including two or more electroactive materials, or a stack including two or more electroactive materials and at least one passive material. In some examples, substantially transparent electrodes may be mounted on the electroactive material(s) for applying a sufficient voltage to deform deformable optical elements including the electrodes. Head-mounted displays including such optical lens assemblies, along with methods of fabricating the same, are also disclosed.

Figure 2:
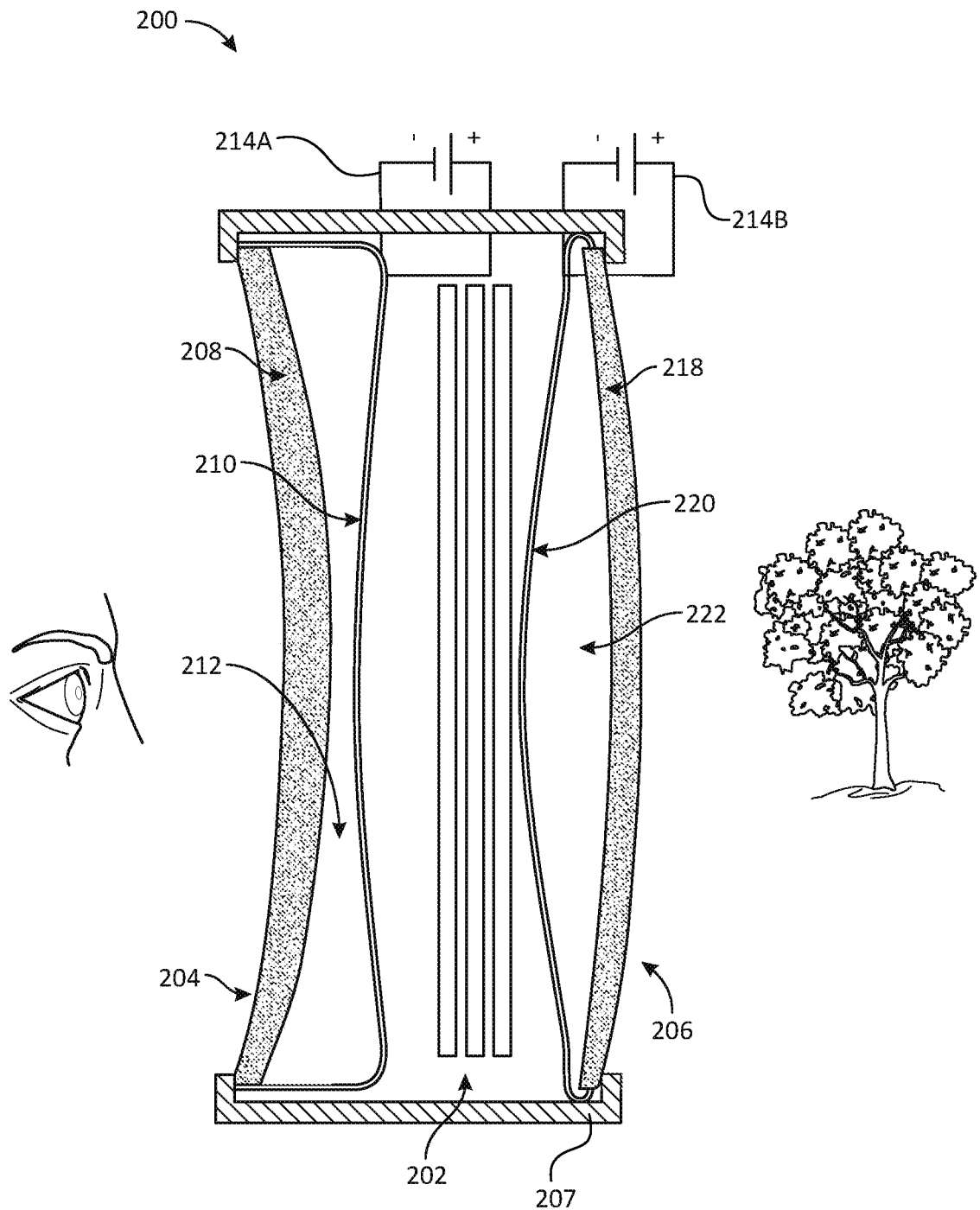
Figure 3:
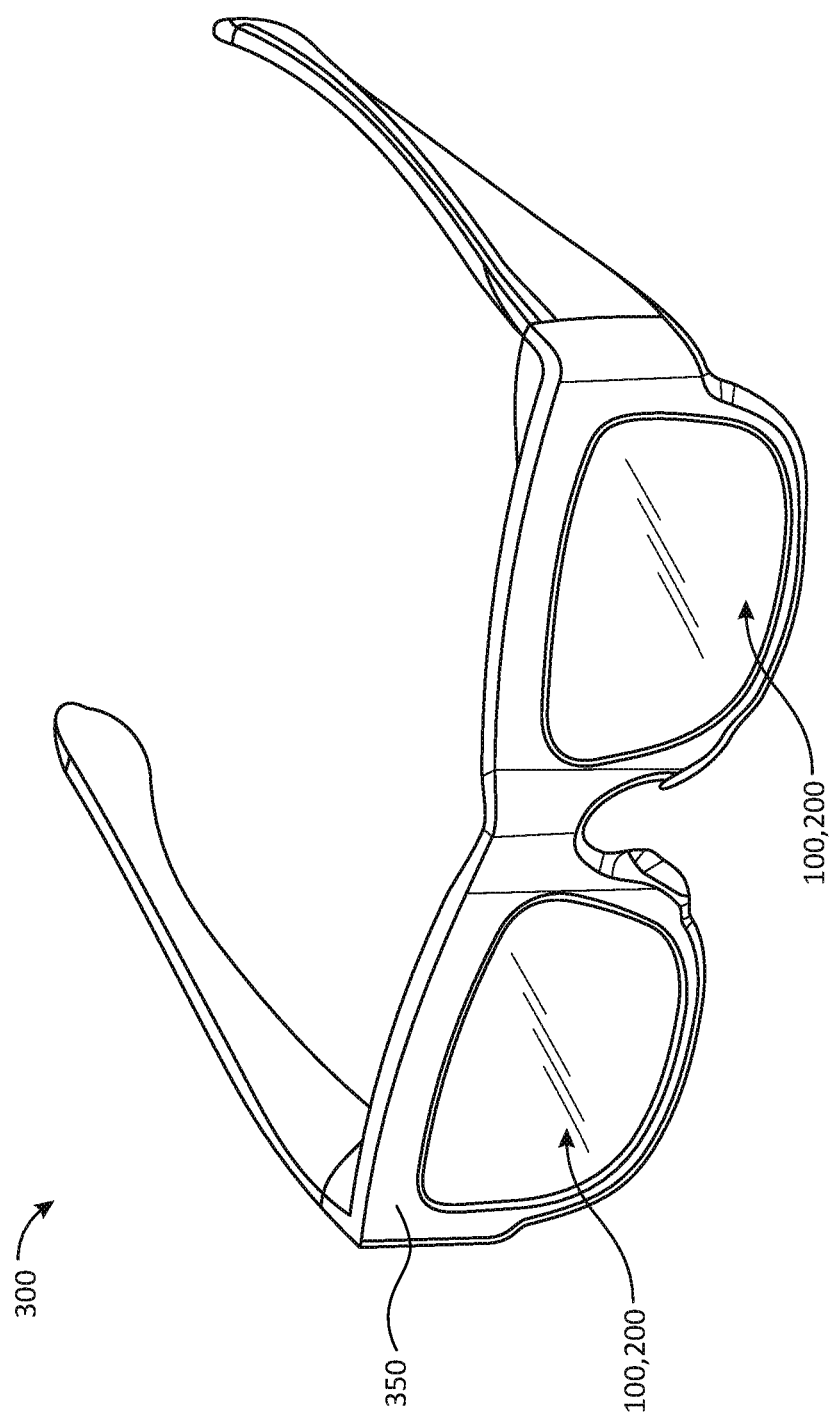
FIG. 3 is a perspective view of an example head-mounted display according to an embodiment of this disclosure.
Figure 4:
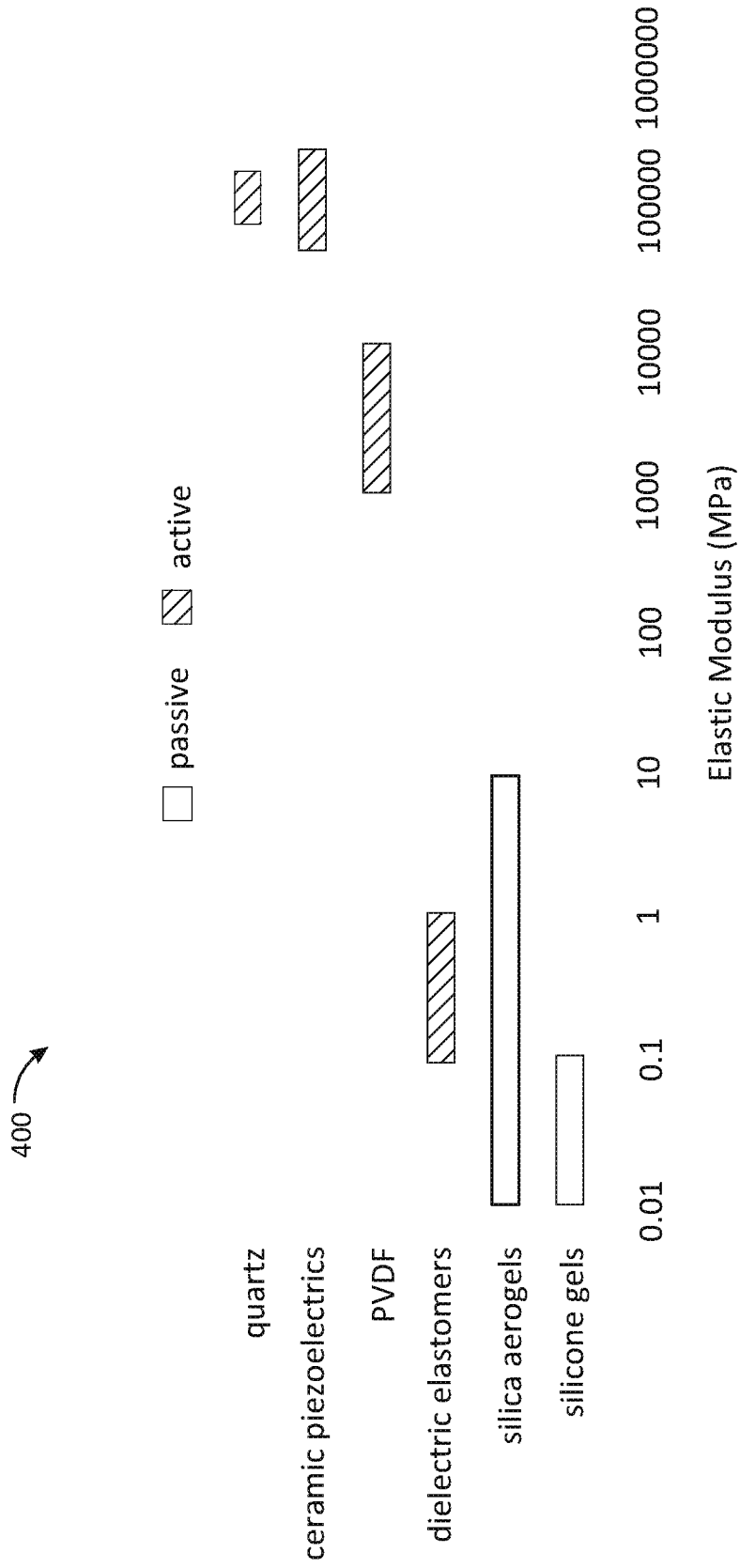
FIG. 4 is an example chart showing elastic modulus properties of several materials.
Figure 8:
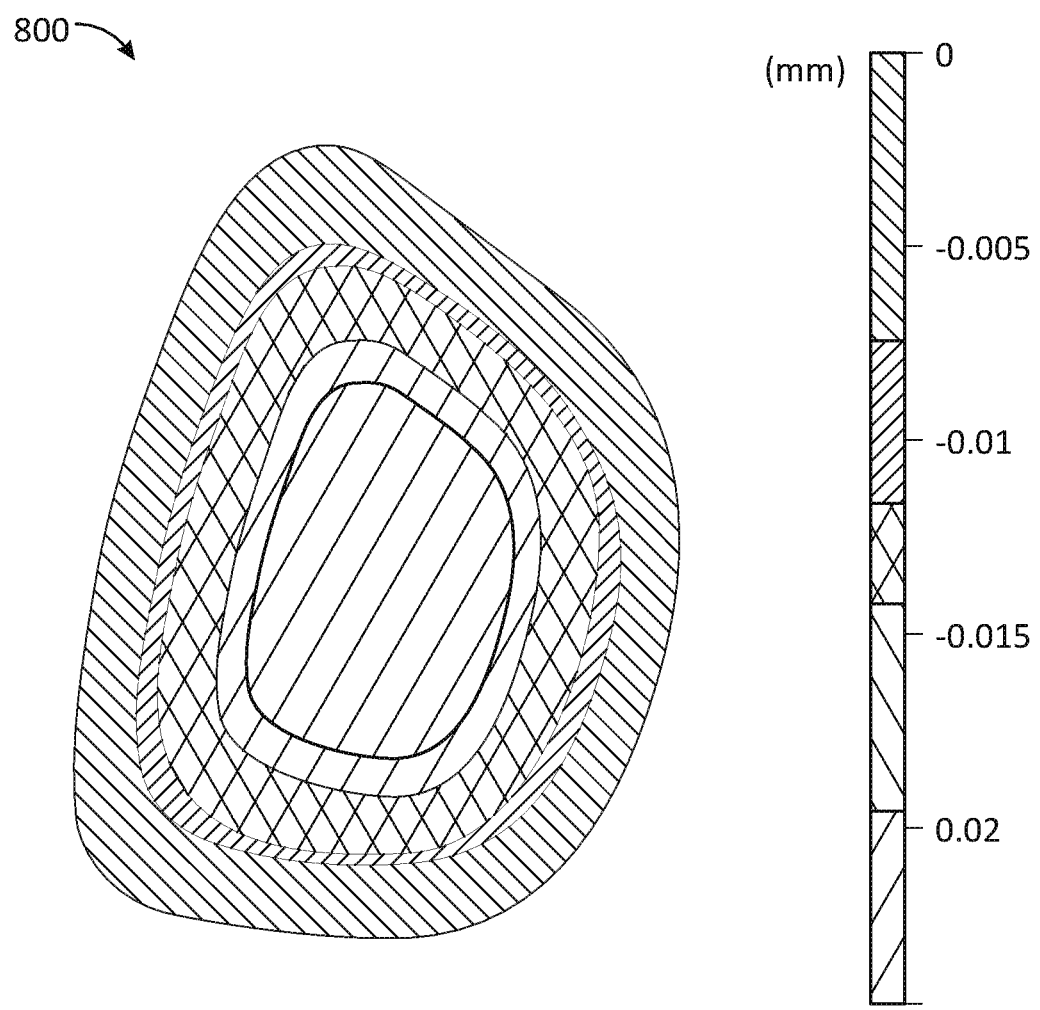
FIGS. 8 and 9 are plots showing calculated deflection values of deformable optical elements according to embodiments of this disclosure.
Figure 9:
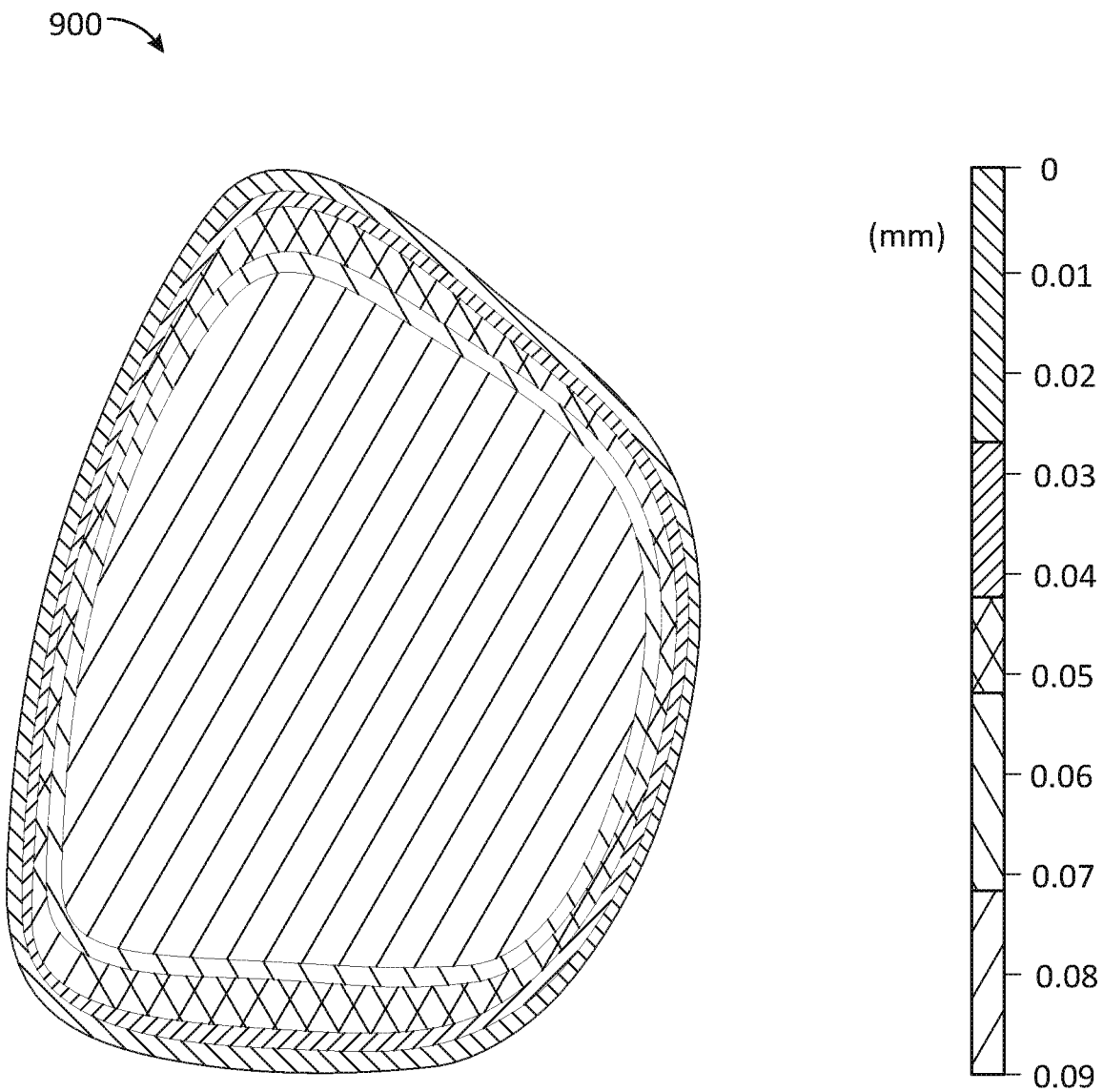
Figure 19:
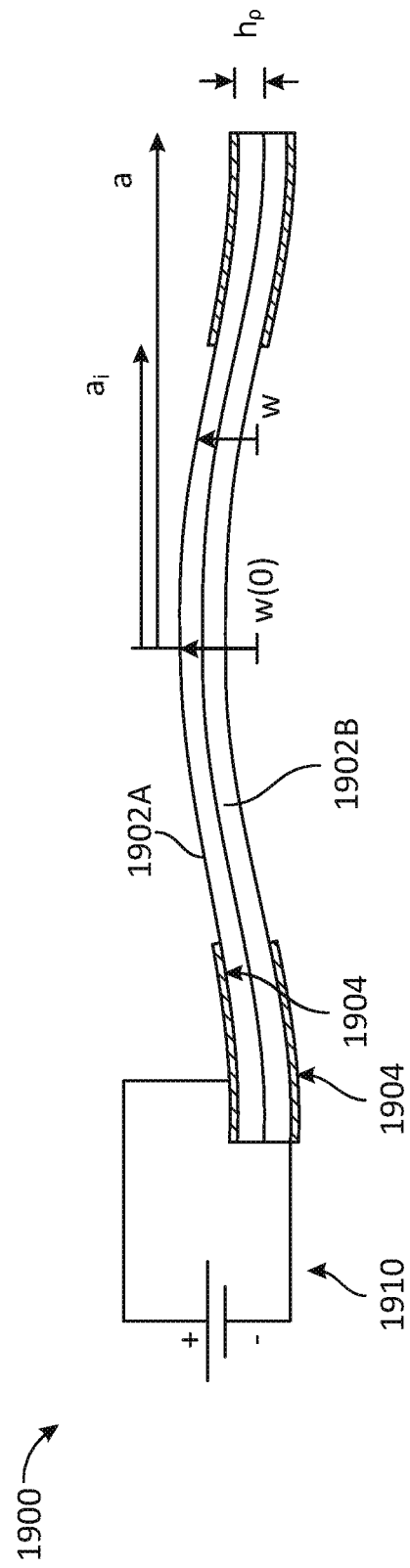
FIG. 19 is a schematic cross-sectional illustration of a substantially transparent transducer including a ring electrode, according to an embodiment of this disclosure.
Figure 20:
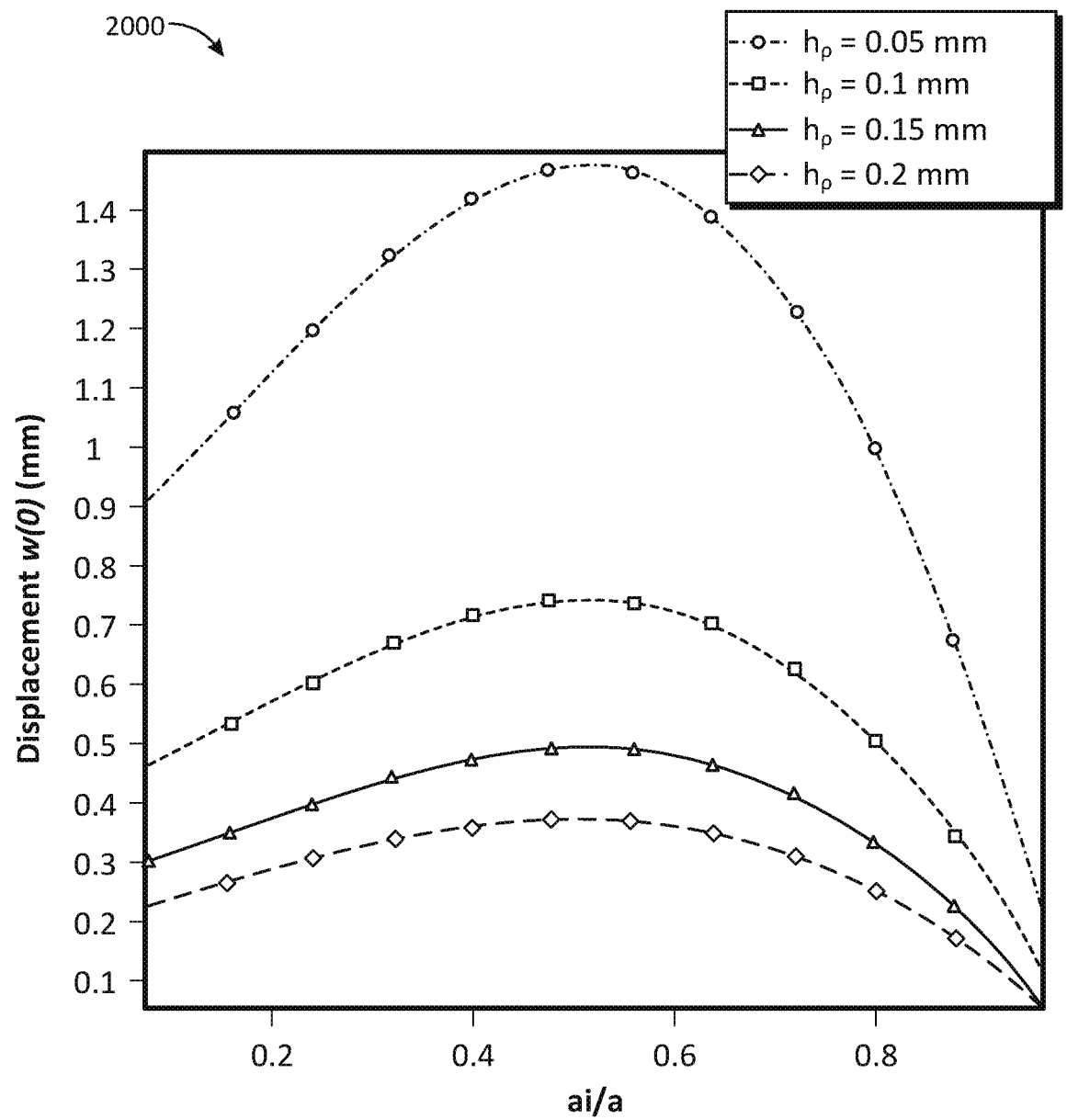
FIG. 20 is a plot showing deflection profiles of a deformable optical element with a ring electrode like the optical lens assembly of FIG. 19, according to various dimensions of the ring electrode.
Figure 21:
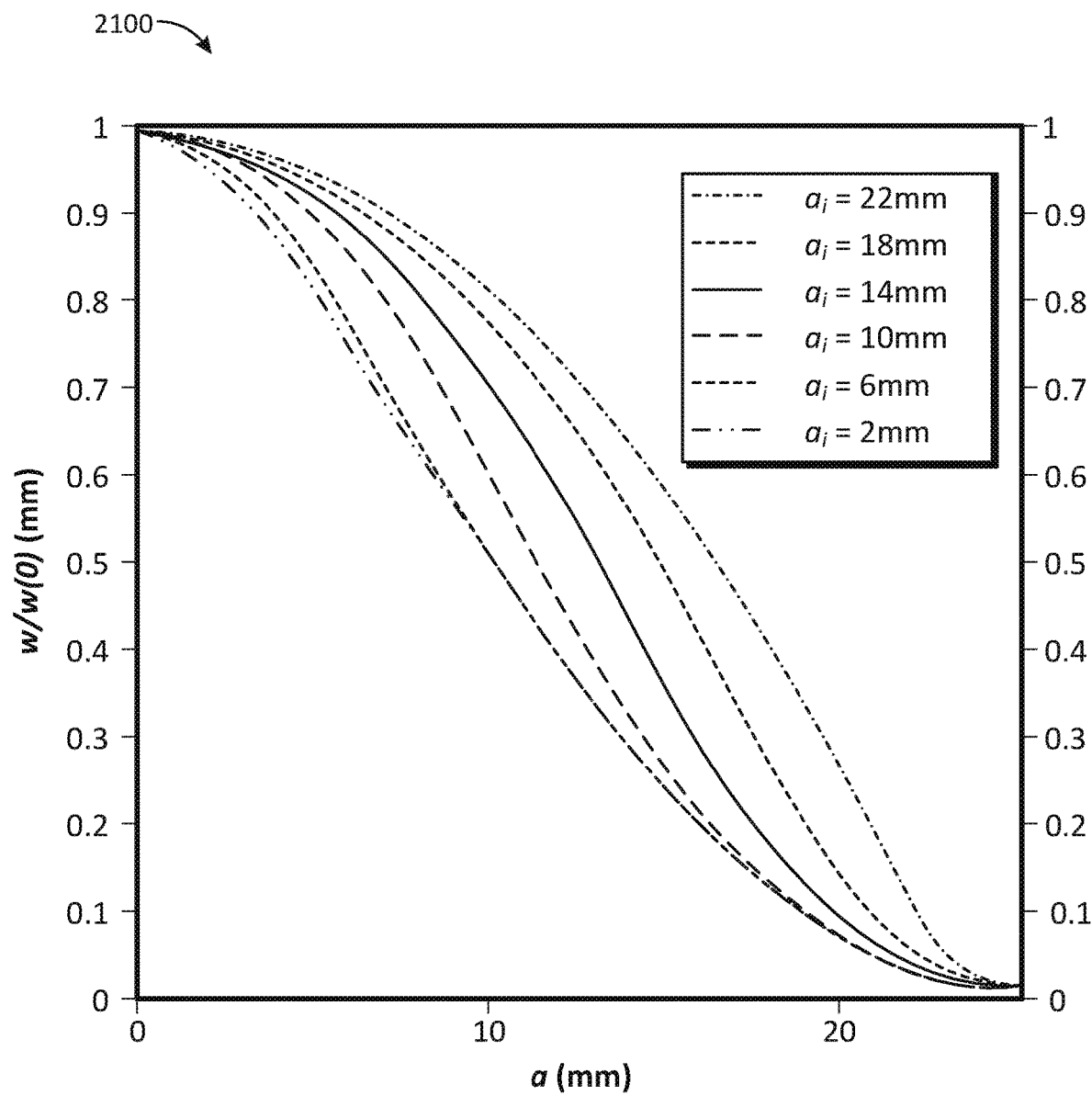
FIG. 21 is a normalized plot showing deflection profiles of a deformable optical element with a ring electrode like the deformable optical element of FIG. 19, according to various dimensions of the ring electrode.
Figure 22:
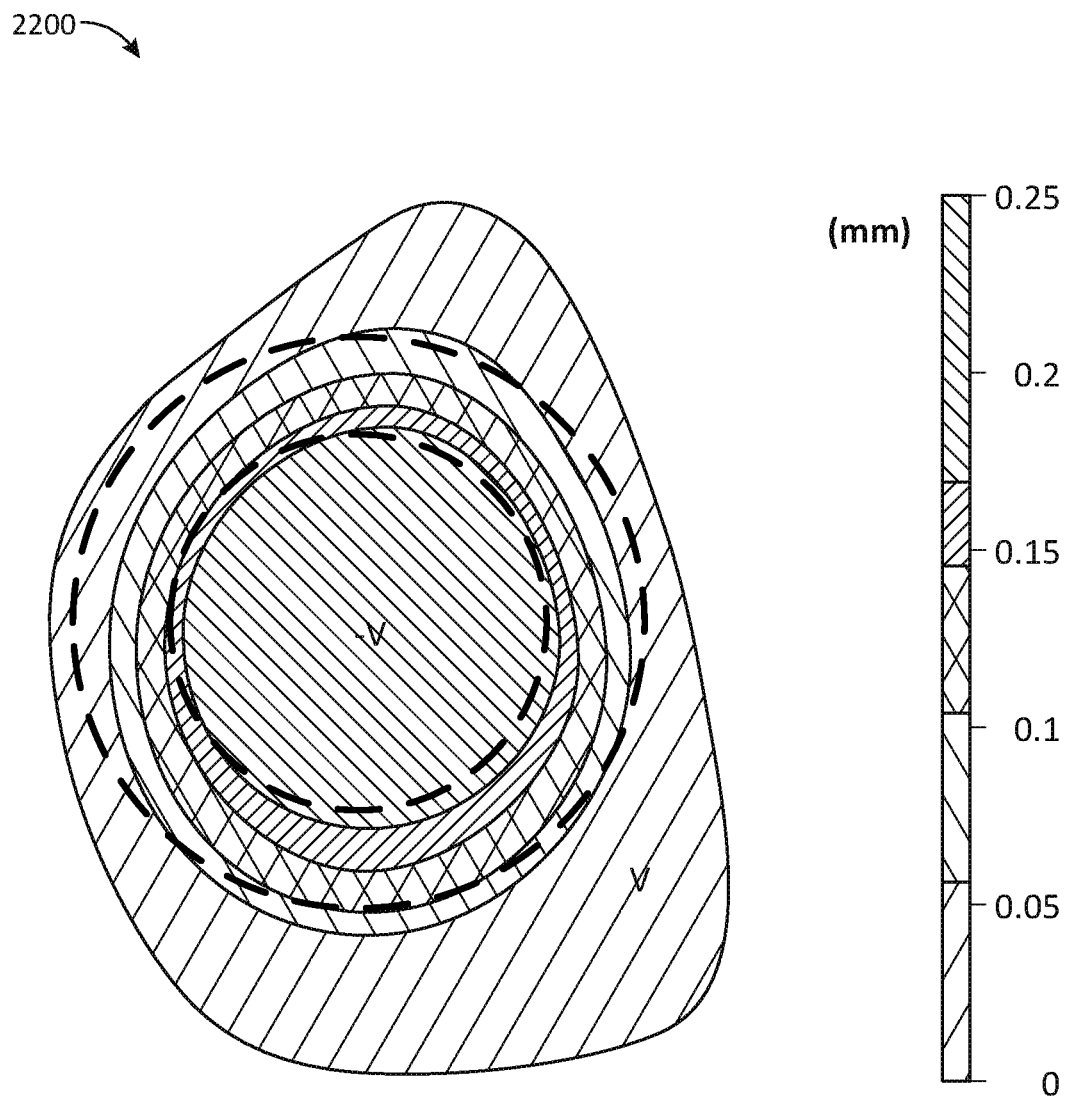
FIG. 22 is a plot showing calculated deflection values of a deformable optical element according to another embodiment of this disclosure.
Figure 23:
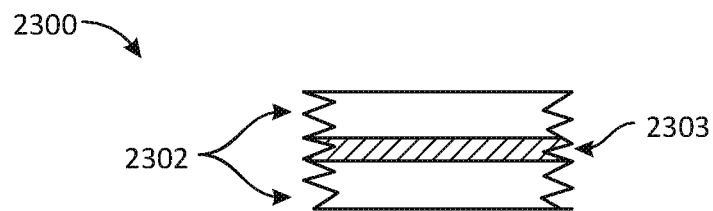
FIG. 23 is a partial cross-sectional view of a substantially transparent transducer including a central support member, according to an embodiment of this disclosure.
Figure 24:
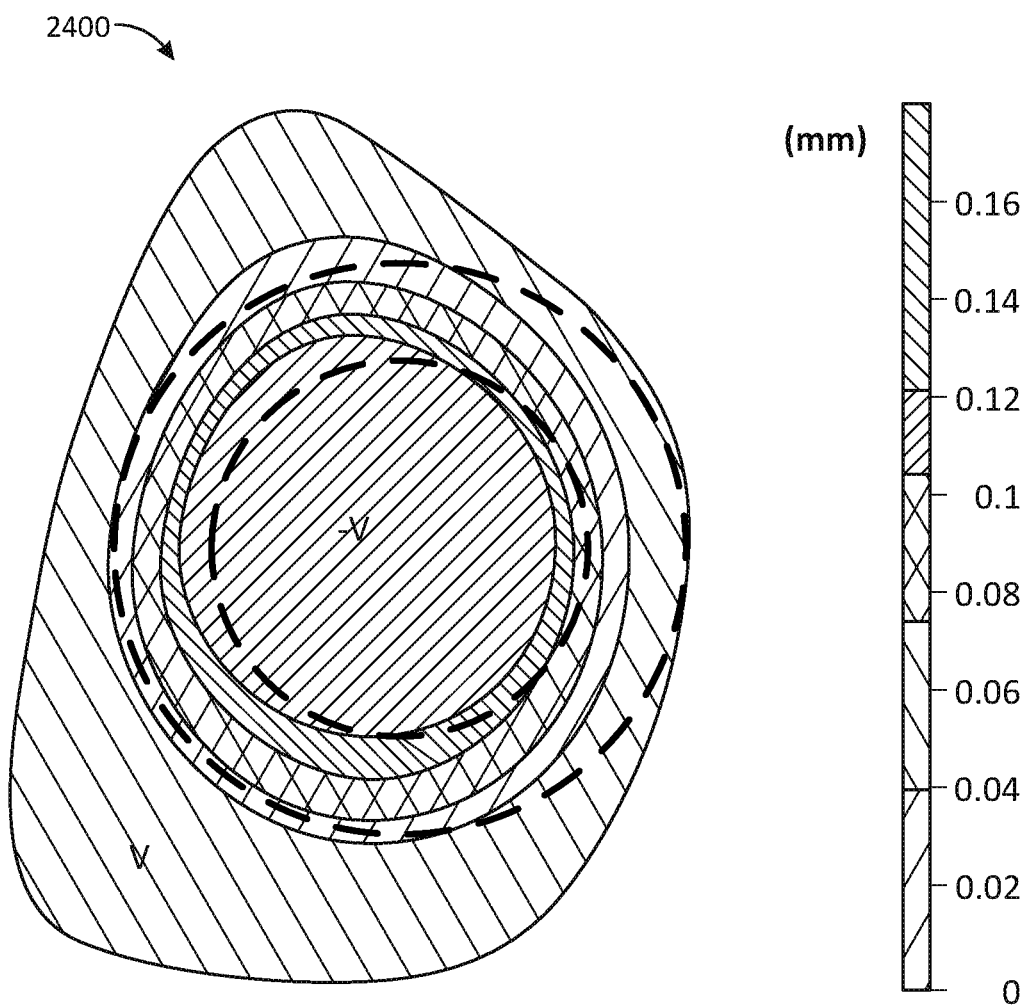
FIG. 24 is a plot showing calculated deflection values of a deformable optical element including a substantially transparent transducer with a central support member like the substantially transparent transducer of FIG. 23, according to an embodiment of this disclosure.
Figure 25A:
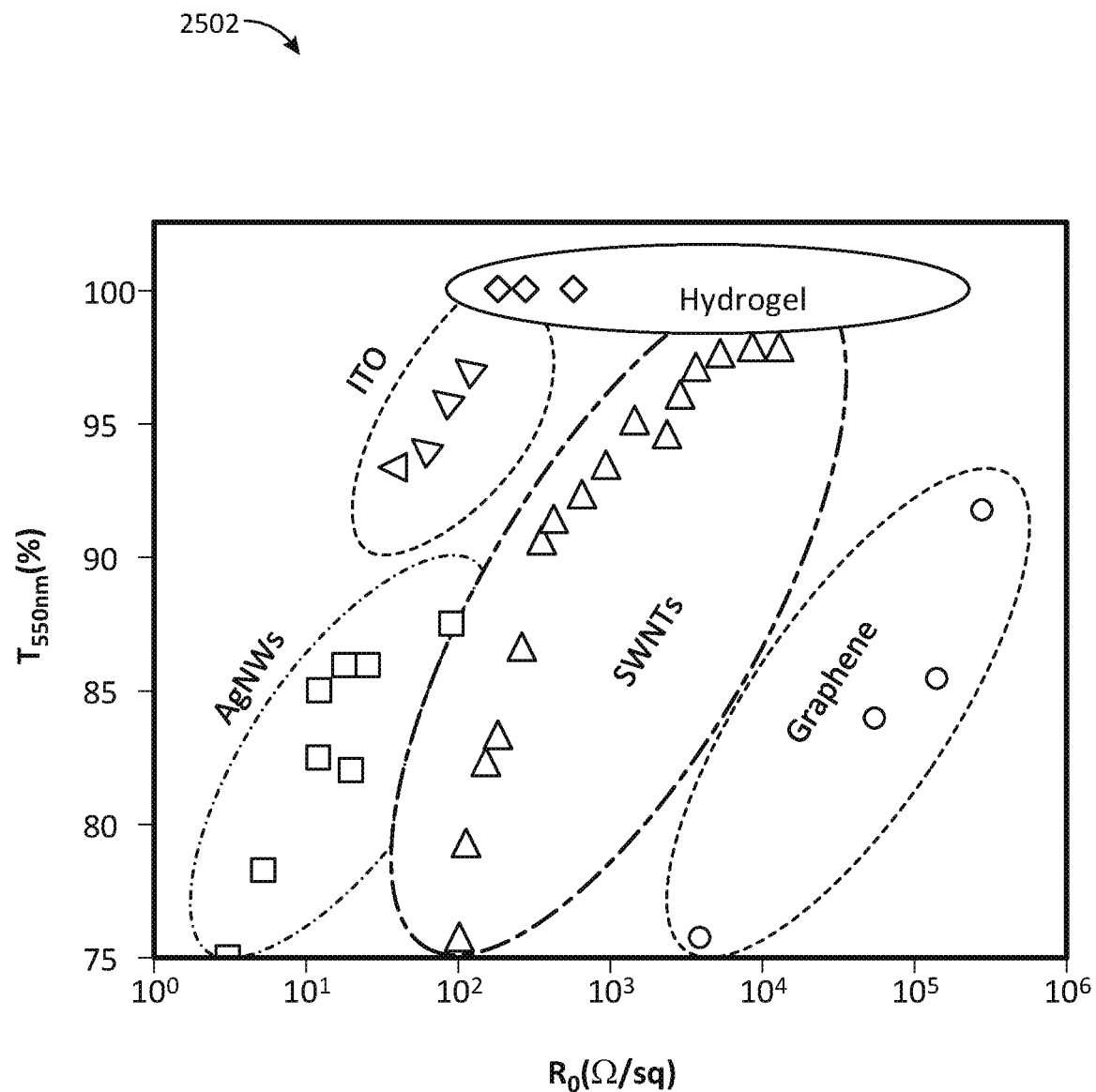
FIG. 25A is an example plot showing optical transmittance properties of materials at different sheet resistance levels.
Figure 25B:
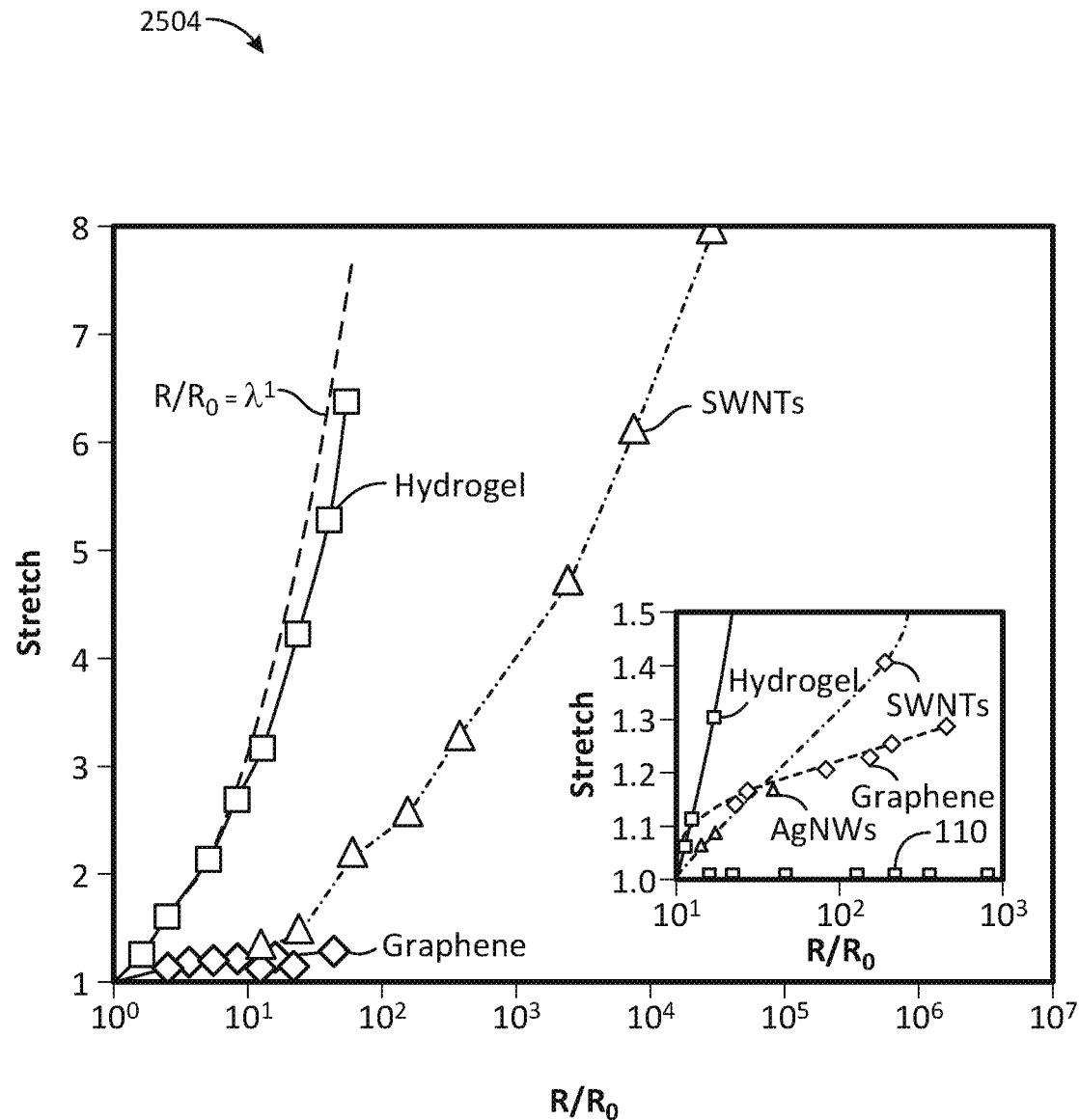
FIG. 25B is an example plot showing stretchability properties of materials at different normalized resistances.
Figure 26:
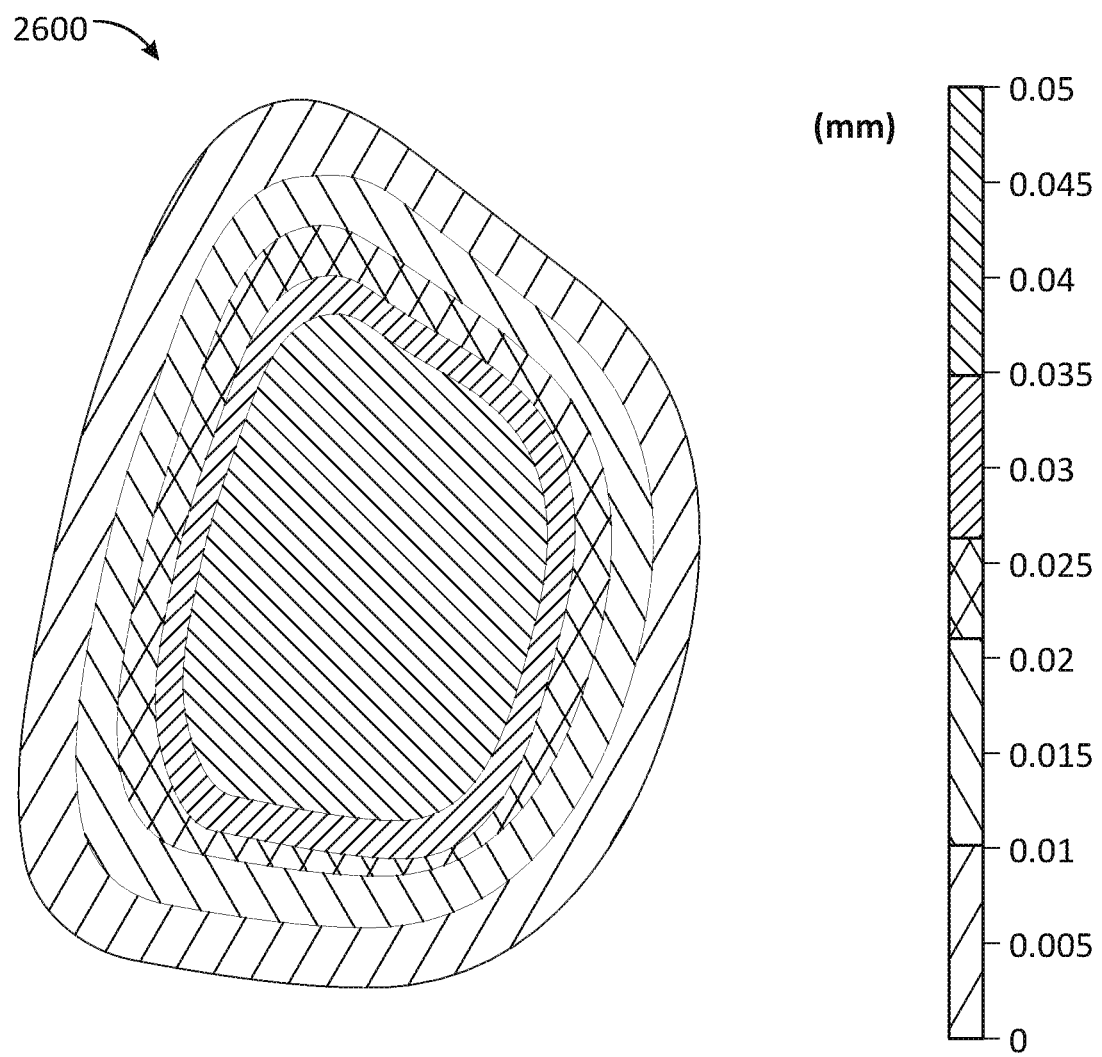
FIGS. 26-28 are example plots showing calculated deflection values of deformable optical elements according to several embodiments of this disclosure.
Figure 27:
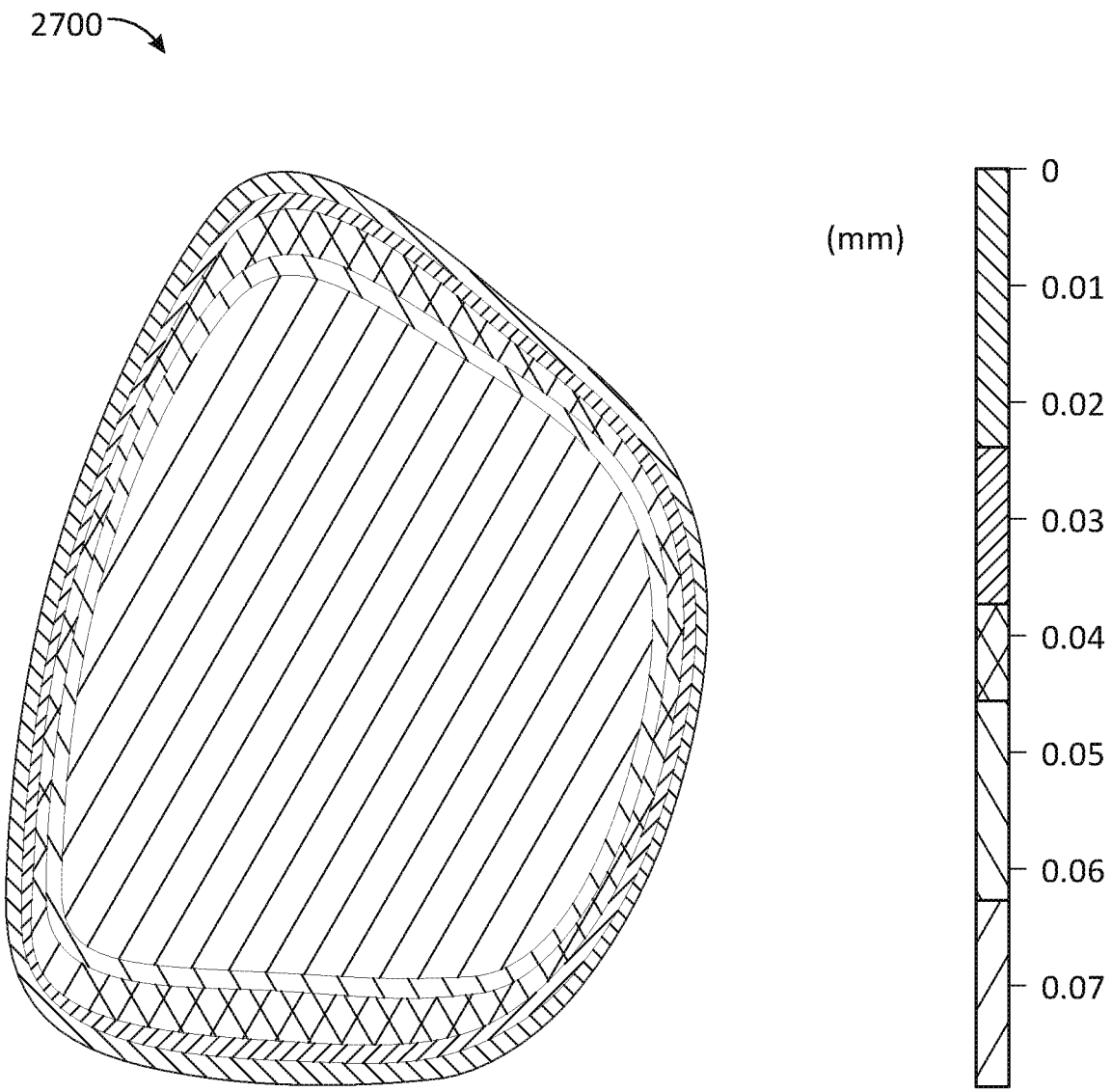
Figure 28:
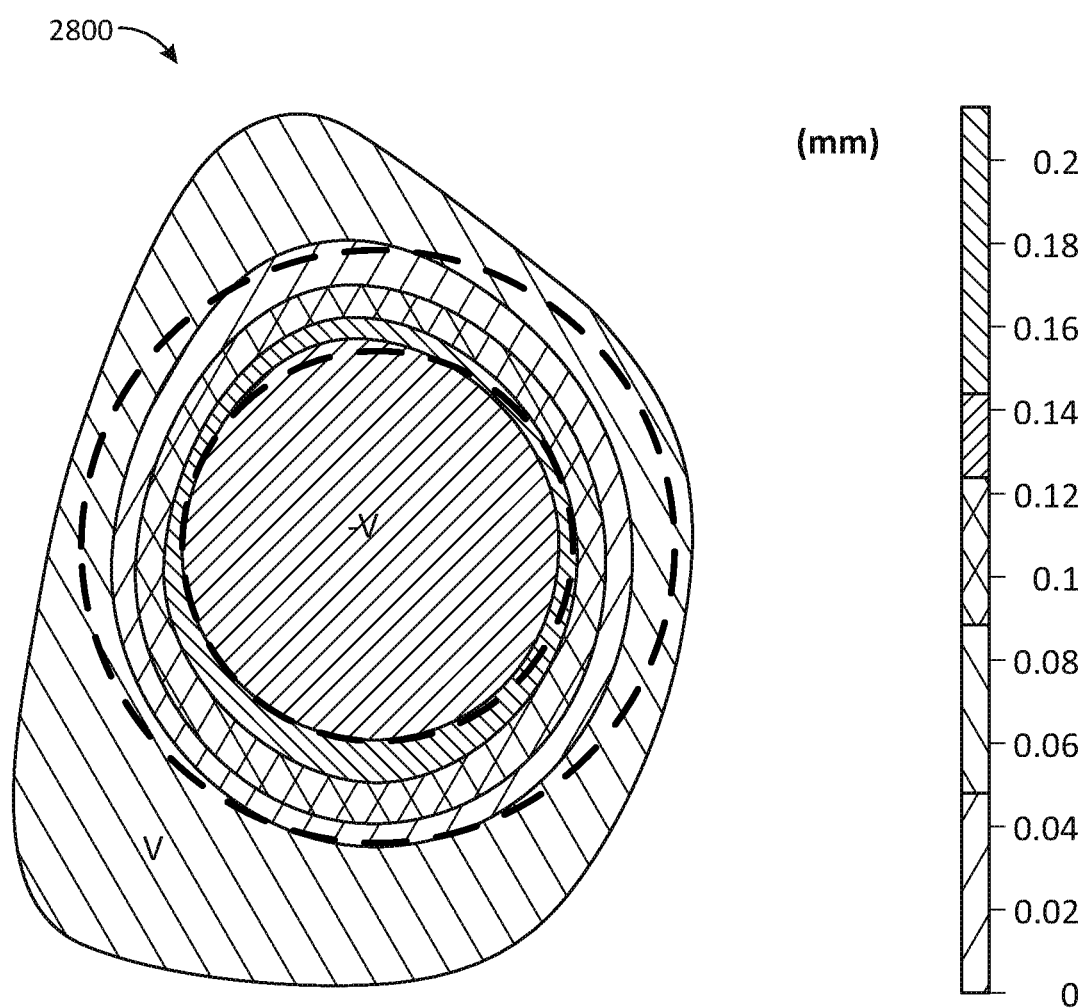
Figure 29:
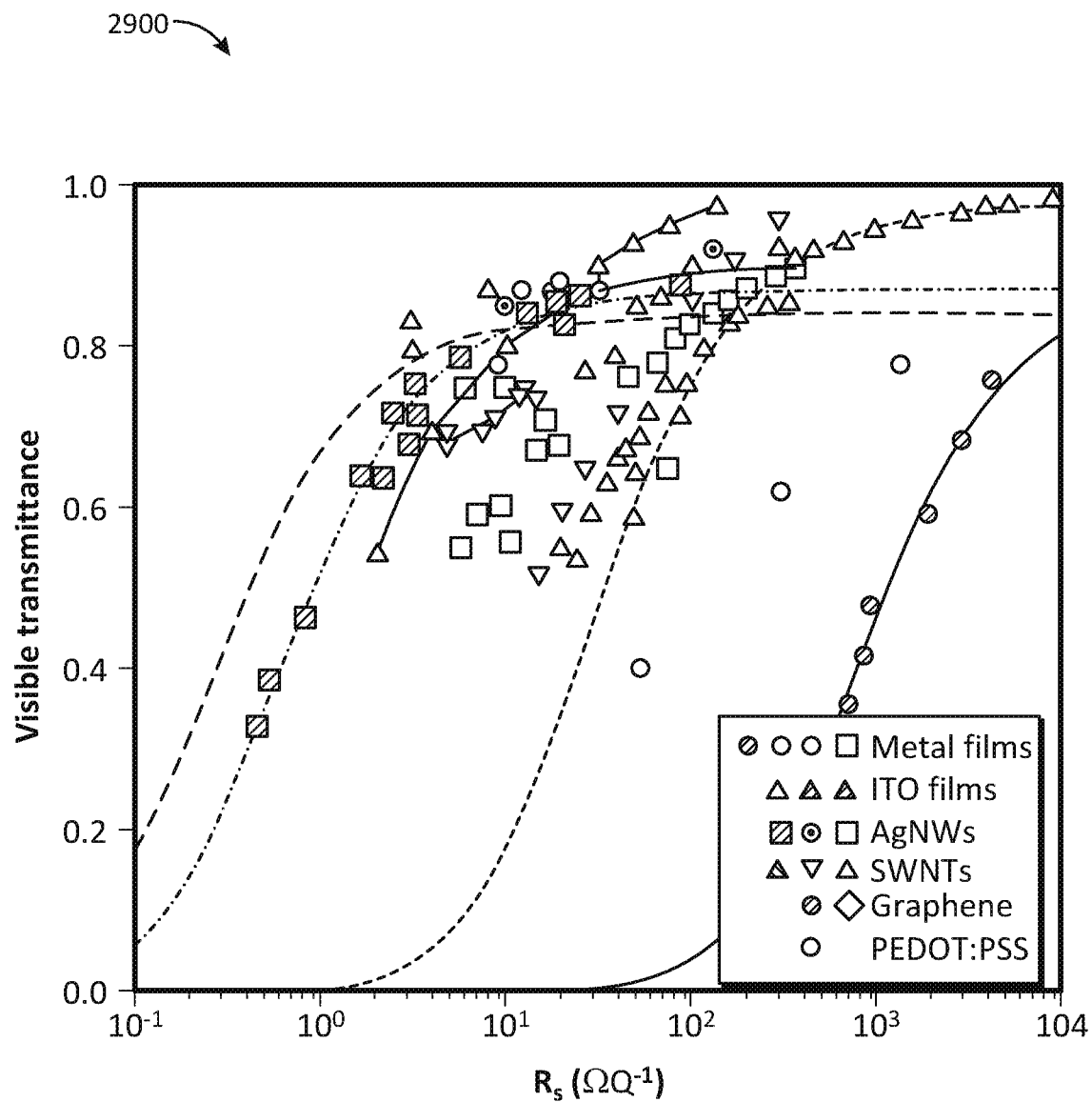
FIG. 29 is an example plot showing visible transmittance properties of various materials as a function of sheet resistance.
Figure 30:
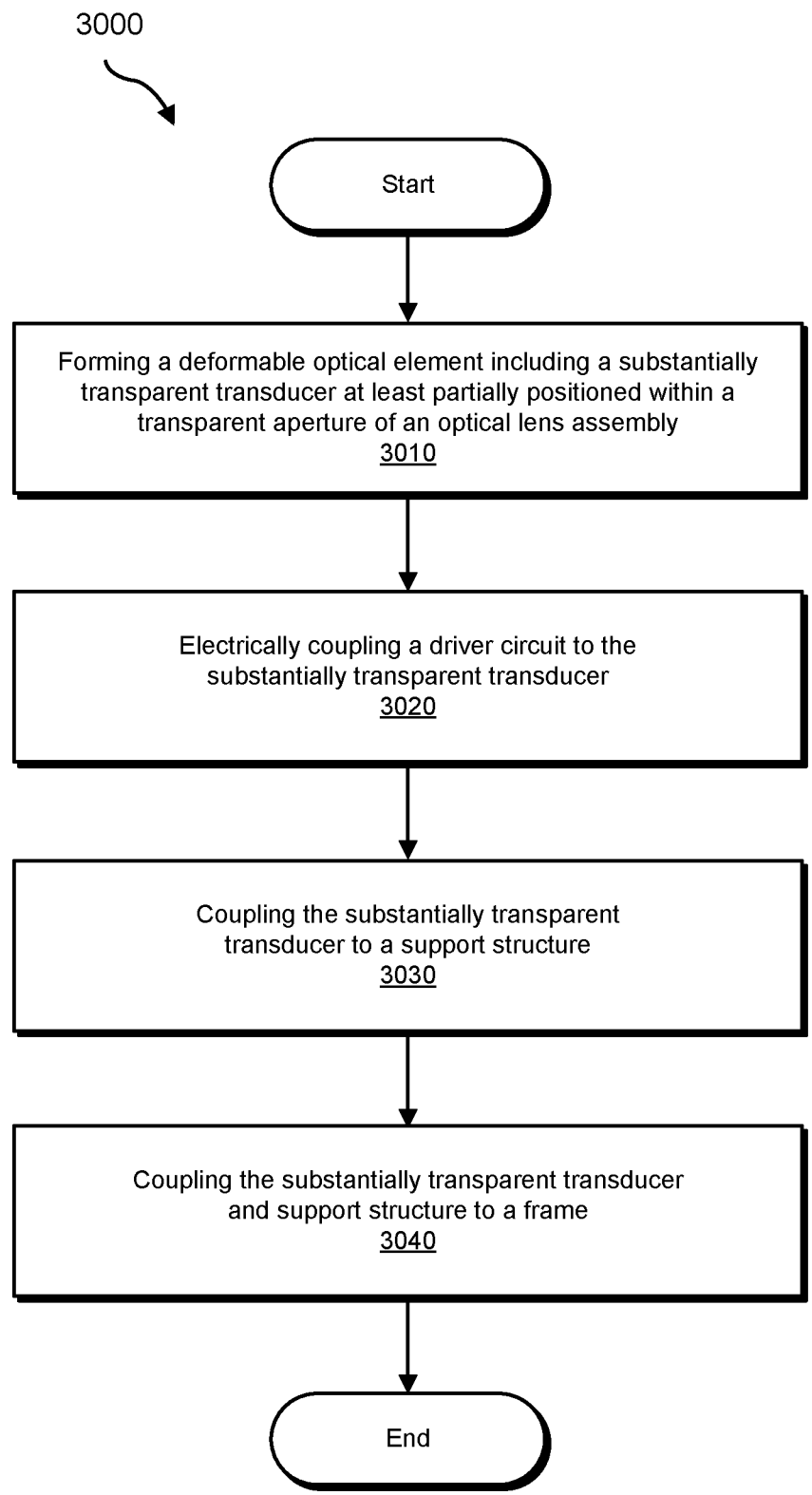
FIG. 30 is a flow diagram illustrating a method of fabricating an optical lens assembly according to an embodiment of this disclosure.

The following will provide, with reference to FIGS. 1-30, detailed descriptions of optical lens assemblies and head-mounted displays, as well as descriptions of related material properties, calculated deflection profiles, and methods. FIGS. 1 and 2 show example optical lens assemblies including deformable optical elements that are configured to deform by transduction within a substantially transparent optical aperture of the optical lens assemblies. FIG. 3 shows an example of a head-mounted display including such optical lens assemblies. FIG. 4 is a chart showing elastic modulus values for several materials that may be suitable for use in optical lens assemblies. FIGS. 5A-7C illustrate several embodiments of optical lens assemblies according to the present disclosure. FIGS. 8 and 9 illustrate calculated deflection values for deformable optical elements with different boundary conditions. FIGS. 10A-13C illustrate additional embodiments of optical lens assemblies according to the present disclosure. FIGS. 14-18 show several examples of substantially transparent transducers according to the present disclosure. FIG. 19 illustrates another embodiment of a substantially transparent transducer that includes a ring electrode. FIGS. 20 and 21 are plots showing deflection profiles of substantially transparent transducers with ring electrodes. FIGS. 22 and 24 illustrate calculated deflection values for deformable optical elements, with FIG. 23 showing an embodiment of a substantially transparent transducer configuration used in calculating the values for FIG. 24. FIGS. 25A and 25B show transmittance and stretchability values for various materials that may be suitable for use in optical lens assemblies. FIGS. 26-28 illustrate calculated deflection values for several embodiments of deformable optical elements. FIG. 29 illustrates visible transmittance values of materials that may be suitable for use in optical lens assemblies. FIG. 30 shows a method of fabricating optical lens assemblies according to some embodiments of this disclosure.

Example implementations of optical lens assemblies as accommodation or adaptive elements in an augmented reality ("AR") HMD are shown in FIGS. 1 and 2. The optical lens assemblies described herein may take a variety of shapes and forms and may include any of a variety of components. As shown in FIG. 1, an optical lens assembly 100 may include a display element 102 (e.g., an RGB waveguide), with proximal and distal deformable optical lens assemblies 104, 106 respectively positioned in front and behind the display element 102 and mounted on a frame 107. The proximal optical lens assembly 104 in front of the display element 102 (i.e., for positioning near the eye) may include a proximal support structure 108, a proximal substantially transparent transducer 110 (also referred to simply as "proximal transducer 110"), and proximal deformable medium 112 between the proximal support structure 108 and proximal transducer 110.

In some examples, the term "transducer" may refer to an energy conversion element or device, such as an element or device that converts electrical energy into mechanical energy. In addition, the phrase "substantially transparent" may refer to an element exhibiting greater than about 20% transmissivity and less than about 10% haze in the visible light spectrum. Similarly, the term "substantially" may, in reference to a given parameter, property, or condition, generally refer to a degree that one of ordinary skill in the art would understand that the given parameter, property, or condition is met with a small degree of variance, such as within acceptable manufacturing tolerances. By way of example, depending on the parameter, property, or condition that is substantially met, the parameter, property, or condition may be at least 90% met, at least 95% met, or even at least 99% met. In some examples, a "deformable optical element" may refer to an element (including one or more materials or sub-elements) that is configured to be deformed to alter an optical property (e.g., an accommodative property or an adaptive optical property) of the optical lens assembly. A deformable optical element may include, for example, the proximal transducer 110 and the proximal deformable medium 112. In some examples, the term "accommodation" may refer to changing an optical power. In addition, the term "adaptive" may, in some examples, refer to tunability for providing control, compensation, and/or correction of wave front errors such as distortion and aberration(s).

As shown in FIG. 1, the distal optical lens assembly 106 may include a distal support structure 118, a distal substantially transparent transducer 120 (also referred to simply as "distal transducer 120"), and a distal deformable medium 122. The support structures 108 and 118 may be or include a substantially transparent material with higher relative rigidity than the transducers 110 and 120 and the deformable media 112 and 122. By way of example, each of the support structures 108 and 118 may represent or include one or more of a glass material, a sapphire material, a crystal material (e.g., quartz), a polycarbonate material, or a polymer material. The support structures 108 and 118 may provide a protective barrier for the user's eye and for the components positioned between the two support structures 108 and 118. The proximal support structure 108 may also include an eye-tracking element, which, if present, may include a selective-transmission element that transmits light having a selected property and that does not transmit light that does not have the selected property. For example, the proximal support structure 108 may include a coating or material that allows visible light to pass while reflecting non-visible light (e.g., infrared light). In this example, an infrared light source (not shown) may direct infrared light to the proximal support structure 108, which may be reflected onto the user's eye. An infrared camera (not shown) may then detect infrared light that is reflected from the user's eye and back to and off of the proximal support structure 108 to track the user's eye.

As shown in FIG. 1, one or both of the support structures 108 and 118 may represent a substantially planar element that does not substantially alter an image viewed through the support structures 108 and 118. In other embodiments, one or both of the support structures 108 may include or represent a corrective ophthalmic lens (e.g., a positive-optical power (i.e., magnifying) lens, a negative-optical power (i.e., diminishing) lens, a lens for correction of an aberration, etc.), or another optical lens element. Optionally, an antireflective coating may be applied to one or both of the support structures 108 and 118. The transducers 110 and 120 may be directly or indirectly coupled to the respective support structures 108 and 118, which may define a cavity therebetween for containing the deformable media 112 and 122.

The transducers described and/or illustrated herein may take any of a variety of forms and may include any number of components or materials. In one embodiment, the transducers 110 and 120 in FIG. 1 may each include at least one substantially transparent electroactive material configured to be respectively actuated in response to an electrical voltage respectively applied by a proximal driving circuit 114A and a distal driving circuit 114B across the electroactive material. In some examples, the term "electroactive" may refer to a property of a material or composite material that deforms in response to an application of electrical energy (e.g., a voltage) and may generate electrical energy when strained or deformed. Electroactive materials, as described in some examples of this disclosure, may function as transducers or as a component of transducers. As will be discussed further in this disclosure below, the transducers 110 and 120 may also include electrode materials that are operatively coupled to the electroactive material(s), for coupling the proximal driving circuit 114A to the electroactive material(s) of the proximal transducer 110. The electrode materials may be disposed on a portion of major surfaces of the electroactive material(s), or may be disposed across substantially an entirety of the major surfaces of the electroactive materials(s).

In some examples, the electrode materials may be or include a substantially continuous, substantially transparent, conductive material. In other examples, the electrode materials may be or include conductive wires disposed on the transducers 110, 120 such as non-intersecting (e.g., evenly spaced parallel, non-evenly spaced parallel, skew, etc.) conductive wires or intersecting (e.g., a crosshatch pattern, a square grid, etc.) conductive wires. In embodiments including intersecting conductive wires, addressable nodes may be included at intersections of the conductive wires, which may be capable of application of varying voltages at the addressable nodes (e.g., a first applied voltage at a first addressable node and a second applied voltage at a second addressable node). For example, the optical lens assembly 100 may be capable of deformation and operation in a bifocal mode by applying different voltages at different addressable nodes, or to correct for optical aberrations or distortions. In additional embodiments, the electrode materials may be arranged to have conductive branching, with a subset of conductive branches that may intersect a conductive wire and other conductive branches that may intersect with the subset of conductive branches. The conductive branching, if present, may provide for the application of a voltage across a wider area compared to embodiments with conductive wires but lacking such conductive branching.

Electroactive materials suitable for the transducers 110 and 120 may include, for example piezoelectric and electrostrictor polymers, ceramics, and minerals; dielectric elastomers; ionic polymer conductors; etc. By way of example and not limitation, elastic piezoelectric polymers may be employed, such as bi-axial polyvinylidene fluoride ("PVDF") or co-polymer poly(vinylidene fluoride-co-trifluoroethylene) ("PVDF-TrFE"). Single crystal materials that may be suitable for the transducers 110 and 120 include, for example, $K_{0.5}Na_{0.5}NbO_3$ ("KNN"), barium titanate, lithium niobate, lithium tetraborate, quartz, $Pb(Mg_{1/3}Nb_{2/3})O_3$—$PbTiO_3$ ("PMN-PT"), $Pb(Zn_{1/3}Nb_{2/3})O_3$—$PbTiO_3$ ("PZN-PT"), etc. In additional examples, the material of the transducers 110 and 120 may be a polycrystalline material. The material of the transducers 110 and 120 may have a perovskite-type crystallography.

In some examples, the electroactive material of the transducers 110 and 120 may include a ceramic material (e.g., a polycrystalline ceramic material), such as a hot-pressed (e.g., pressed at high pressure and hot isostatic pressure), vacuum sintered, spark plasma sintered, and/or microwave sintered ceramic material. In such examples, a precursor powder material may be pressed and/or heated to form the electroactive material of the transducers 110 and 120. Powder may be formed by various methods, such as by grinding the material, abrading the material, chemical co-precipitation, and/or sol-gel and gel combustion. In some embodiments, a green body may initially be formed prior to hot-pressing and/or sintering, such as by tape casting, slip casting, or gel casting a powdered ceramic material.

For example, hot-pressed lead zirconate titanate ("PZT") may be used for the transducers 110 and 120. In this example, the hot-pressing process may increase a density of the PZT (relative to conventional processes), which may in turn increase the transmissivity and optical transparency of the electroactive material (since, e.g., increased densities may lower the effects of scattering, which may negatively impact transmissivity).

In some embodiments, the density of the hot-pressed PZT (or other materials formed from a powdered precursor) may be further increased by including a dopant, such as niobium (Nb), lanthanum (La), barium (Ba), etc. In these embodiments, this increase in density may further increase the transmissivity and optical transparency of the electroactive material. Additional examples of hot-pressed polycrystalline ceramic materials (which may or may not include a dopant for further increasing the density) may include KNN, barium titanate, lead zirconate titanate ("PZT"), PMN-PT, and/or PZN-PT. Such materials may be fabricated by hot-pressing (e.g., applying heat and pressure to) a powdered ceramic material or powdered ceramic compact, which may optionally include a dopant (e.g., a powdered dopant), as described above. In some embodiments, the resulting material may be polished.

Actuation of the transducers 110 and 120 by the driving circuits 114A and 114B may result in deformation of the deformable optical elements, and thereby adjustment of an optical property of the optical lens assemblies 104 and 106. For example, deformation of the proximal transducer 110 by the proximal driving circuit 114B may result in adjusting the focus of a virtual image displayed by the display element 102 and/or of a real-world view from the perspective of the user's eye. In this example, the distal deformable lens assembly 106 behind the display element 102 may be simultaneously and conversely actuated (e.g., into a concave state when the proximal transducer 110 is actuated into a convex state, into a convex state when the proximal transducer 110 is actuated into a concave state, etc.) by the distal driving circuit 114B to result in a zero-optical power view of the real world. In other examples, the proximal and distal deformable lens assemblies may be independently or separately actuated. Voltage polarity changes may alternate deformation of the transducers 110 and 120 between convex and concave states. Upon actuation, at least a portion of the deformable media 112 and 122 may deform and/or flow to conform to a shape of the respective transducers 110 and 120. In some embodiments, actuation by the transducers 110 and 120 may be augmented by one or more electromechanical elements, such as a rotational or linear transducer.

The deformable media described and/or illustrated herein may take any of a variety of forms and may include any number of components or materials. In the example illustrated in FIG. 1, the deformable media 112 and 122 may represent or include a substantially transparent material with mechanical properties that allow for deformation upon actuation, as described above. By way of example and not limitation, the deformable media 112 and 122 may represent or include a gas (e.g., air, nitrogen, etc.), a liquid (e.g., water, saline solution, a high-refractive index liquid, etc.), a polymer material, a gel (e.g., a silicone gel), a foam (e.g., a silica aerogel), etc. Some considerations for selecting a suitable deformable medium 112 or 122 are discussed below with reference to FIG. 4.

In some examples, the display element 102 may also be substantially transparent. Due to the substantial transparency of the display element 102, support structures 108 and 118, deformable media 112 and 122, and transducers 110 and 120, an optical aperture of the optical lens assembly 200 (including respective optical apertures of the optical lens assemblies 104 and 106) may be substantially transparent. Thus, in some examples, the optical lens assembly 100 may be characterized as including a deformable element including at least a portion of a substantially transparent transducer (e.g., one or both of the transducers 110 and 120) that is positioned within a substantially transparent optical aperture of the optical lens assembly 100, or of the optical lens assemblies 104 and/or 106. The term "optical aperture" may, in some examples, refer to a portion of an optical lens assembly or head-mounted display through which a user may view a virtual image and/or a real-world environment.

FIG. 2 illustrates another embodiment of an optical lens assembly 200 that is similar to the optical lens assembly 100 of FIG. 1. For example, the optical lens assembly 200 of FIG. 2 may include a display element 202, a proximal optical lens assembly 204, and a distal optical lens assembly 206. The proximal optical lens assembly 204 may include a proximal support structure 208, a proximal substantially transparent transducer 210, and a proximal deformable medium 212. The distal optical lens assembly 206 may include a distal support structure 218, a distal substantially transparent transducer 220, and a distal deformable medium 222. The display element 202 and optical lens assemblies 204, 206 may be mounted on a frame 207. Driving circuits 214A, 214B may be operably coupled to the respective proximal and distal transducers 210, 220 for actuating the proximal and distal transducers 210, 220. However, the optical lens assembly 200 of FIG. 2 may differ from the optical lens assembly 100 of FIG. 1 in that the proximal and distal support structures 208, 218 may be curved, as illustrated in FIG. 2. For example, one or both of the proximal and distal support structures 208, 218 may be or include a corrective ophthalmic lens, or a curved zero-optical power lens (e.g., a zero-power meniscus lens). A shape of the proximal and/or distal support structures 208, 218 may, in some embodiments, be tailored to or selected in consideration of a specific user to correct vision impairments or to otherwise meet user preferences. A zero-optical power curved lens may provide some advantages over a substantially planar lens, such as improved anti-reflective properties and/or improved fit to a user's facial contours.

In some examples, for realization of a sub-assembly with similar functionality to the sub-assembly in FIG. 1, the outside facing and eye side support structures 208, 218 in FIG. 2 can be zero-power meniscus lens elements for improved anti-reflective properties and easier integration with potentially non-flat optical eye-tracking and/or ophthalmic optical elements at the proximal support structure 208.

FIG. 3 shows an HMD 300 including the optical lens assemblies 100 or 200 of FIG. 1 or FIG. 2 integrated into a single eyeglass frame 350. Each of the optical lens assemblies 100 or 200 may be tailored to or selected in consideration of a particular user's eye. In addition to supporting the optical lens assemblies 100 or 200, the eyeglass frame 350 may also support other elements, such as driving circuits, a power supply element (e.g., a battery), a communication component (e.g., a component for communication via WIFI, BLUETOOTH, near-field communications ("NFC"), or a wired connection, etc.), a graphics processing unit for rendering an image on the display element(s), an image sensor, etc. In addition, the HMD 300 may have another shape and design than is shown, such as in the form of a VR headset or another shape that suits user preferences.

Elastic modulus properties of various materials that may be included within or used to form the optical lens assemblies described herein are presented in FIG. 4. Depending on the selected deformable medium, an edge seal may be employed to encapsulate a liquid, gaseous, or diffusible medium along a perimeter between the support structure and transducer. In some embodiments, an edge seal may be formed by a portion of the transducer that is coupled to the support structure (e.g., via an adhesive). In other embodiments, a separate material coupled to and between the support structure and the transducer may be used to form the edge seal, if present.

Liquids or gases may be employed as deformable media in some embodiments because of their high mobility compared to solids. However, liquids and gases as deformable media tend to require an edge seal, which may add complexity, and possibly weight and bulk, to the overall assembly. In addition, a negative pressure differential that may be imposed when the optical lens assemblies are in a concave state may exacerbate potential diffusion issues with the external environment. By way of example and not limitation, a relatively high-refractive index fluid (e.g., a fluid having a refractive index of greater than about 1.35) may be included as the deformable medium to reduce a size of the optical lens assembly, since relatively less deformation of the deformable optical element (e.g., the deformable medium and the transducer) may be required to achieve a similar shift in optical power compared to relatively lower-refractive index fluids. Gases tend to exhibit lower refractive indices than liquids, so a larger cavity between the support structure and the transducer may be required for a gas deformable medium to realize a similar optical performance, compared to a liquid deformable medium.

A "solid" deformable medium (e.g., a gel, a viscoelastic polymer, a foam, etc.) may not require an edge seal, but may require more mechanical energy for deformation compared to a liquid or a gas. For an efficient design, a solid deformable medium exhibiting a mechanical stiffness that is less than a stiffness of the transducer may be selected. The plot 400 of FIG. 4 compares the elastic moduli (as a rough estimation of stiffness) of substantially transparent, passive solid media (silica aerogels and silicone gels) with substantially transparent electroactive materials for potential use in transducers of optical lens assemblies. The low modulus of a silica aerogel or silicone gel may be compatible with a stiffer electroactive material, as a majority of applied energy may, in some configurations, result in deformation of the transducer rather than to deformation of the solid deformable medium. As a porous material, foam tends to exhibit a lower refractive index than a continuous material, and therefore a larger thickness may be required in some embodiments, compared to some gels and liquids. Silicone gels can be substantially transparent, with good optical clarity and a high refractive index (e.g., about 1.5) enabling thinner and potentially lighter-weight designs to obtain a given optical property. However, gels are commonly used for damping, so it is likely that gel-based designs could lead to a relatively slower response time and/or increased actuation energy. Nonetheless, gels may be employed as a deformable medium in some embodiments. These and other considerations may be used by one skilled in the art to select appropriate materials for a given application.

Figure 5A:
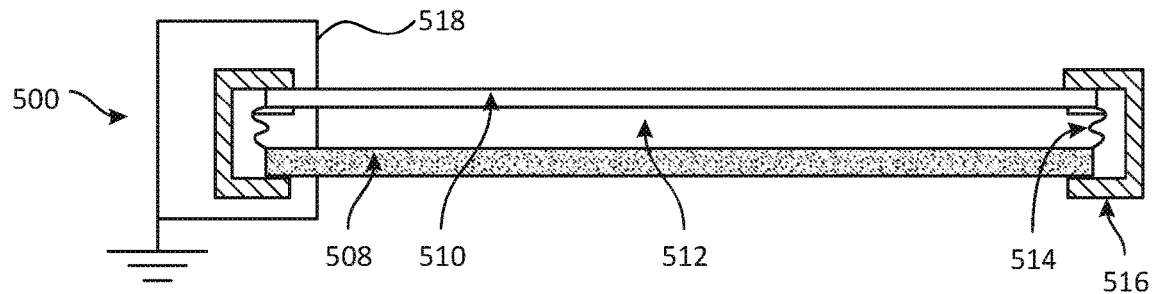
FIGS. 5A-5C are schematic cross-sectional illustrations of an optical lens assembly according to an embodiment of this disclosure, respectively in a non-actuated state, a convex actuated state, and a concave actuated state.
Figure 5B:
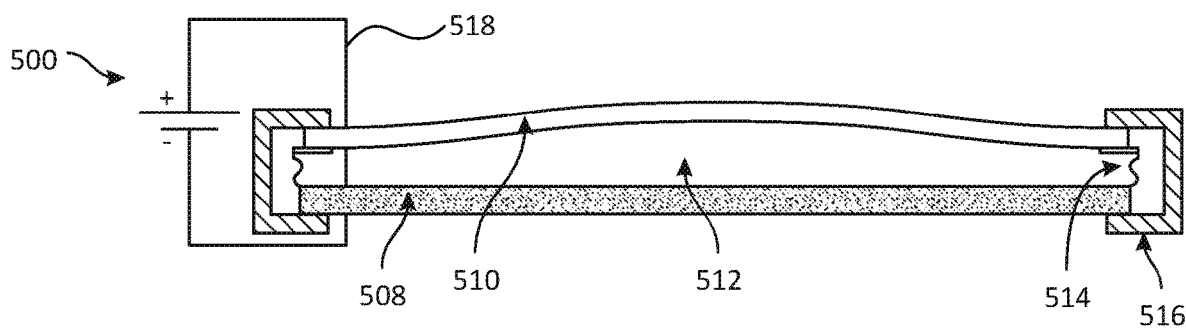
Figure 5C:
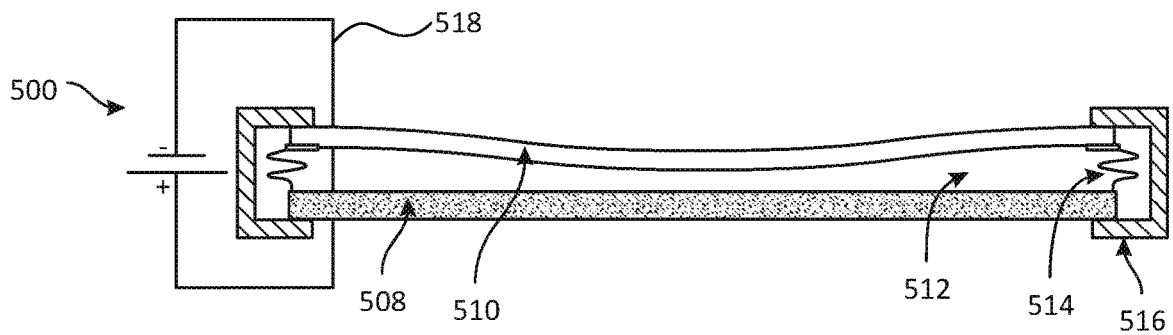

FIGS. 5A-5C show an example deformable optical lens assembly 500 according to an embodiment of the present disclosure. FIG. 5A illustrates the optical lens assembly 500 in a neutral, non-actuated state, FIG. 5B illustrates the optical lens assembly 500 in a concave actuated state, and FIG. 5C illustrates the optical lens assembly 500 in a concave actuated state. The optical lens assembly 500 may include a support structure 508, a substantially transparent transducer 510 (also referred to simply as "transducer 510"), deformable medium 512, edge seal 514, and frame 516. The transducer 510 and the deformable medium 512 may collectively be referred to as, or as a part of, a deformable optical element. The deformable medium 512 may, in some examples, be an incompressible high-refractive index fluid. In examples in which the deformable medium 512 is an incompressible fluid, a volume of a cavity containing the deformable medium 512 may remain substantially constant, even upon deformation of the transducer 510 and the deformable medium 512. An edge of the transducer 510 may be fully or partially fixed to the frame 516 of an HMD or other optical lens assembly. Partial clamping could, in some embodiments, be employed, such as for an asymmetric optical lens assembly with an optical center and/or deflection profile that varies from its natural mode shape. Imposing an alternative boundary condition to fully fixed (e.g., fully clamped or adhered) may allow non-uniform edge deflection that may be tailored to a desired deflection profile.

FIGS. 5A-5C show a baffle- or bellows-type edge seal 514 encapsulating a fluid deformable medium 512 between the transducer 510 and support structure 508. The edge seal 514 may be coupled to the transducer 510 and to the support structure 508. In the neutral state shown in FIG. 5A, the shape of the transducer 510 may result in a zero-optical power optical lens assembly 500 (e.g., may be substantially planar or may have a curvature substantially corresponding to a curvature of the support structure 508). When a positive voltage is applied to the transducer 510 by a driving circuit 518, the transducer 510 may deform to create a convex lens shape. Actuation of the transducer 510 may result in a pressure differential that results in movement of the deformable medium 512. For example, the deformable medium 512 may move toward a central region and the edge seal 514 may deflect inward as the transducer 510 is actuated to a convex shape, as shown in FIG. 5B. For a negative curvature lens, the polarity of the voltage applied by the driving circuit 518 may be reversed and the edge seal 514 may expand outward to accommodate movement of the deformable medium 512 toward a peripheral region, as shown in FIG. 5C. Alternatively, the transducer 510 may be mounted to exhibit an opposite polarity to that illustrated in FIGS. 5A-5C, such that a negative applied voltage may result in a convex lens shape and a positive applied voltage may result in a concave lens shape.

Figure 6A:
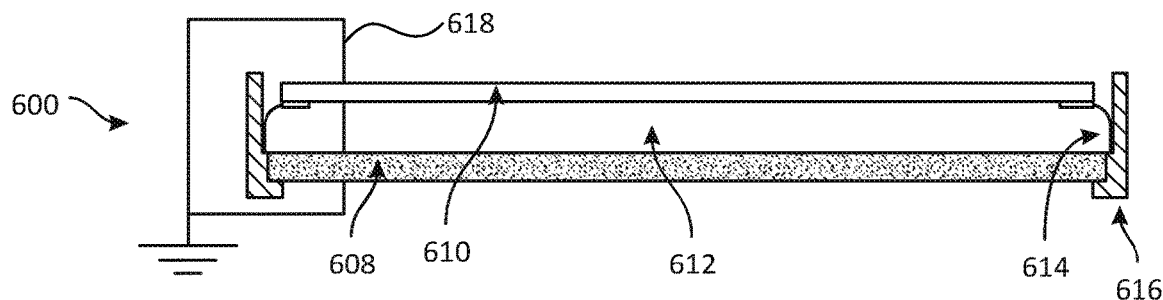
FIGS. 6A-6C are schematic cross-sectional illustrations of an optical lens assembly according to another embodiment of this disclosure, respectively in a non-actuated state, a convex actuated state, and a concave actuated state.
Figure 6B:
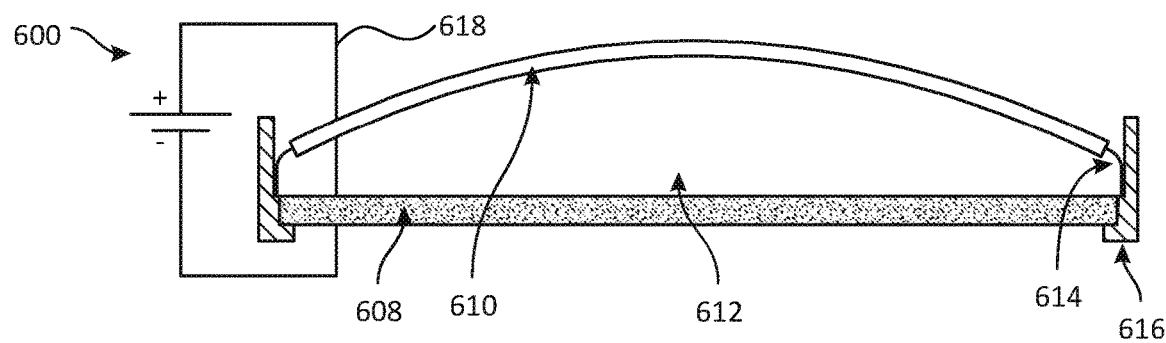
Figure 6C:
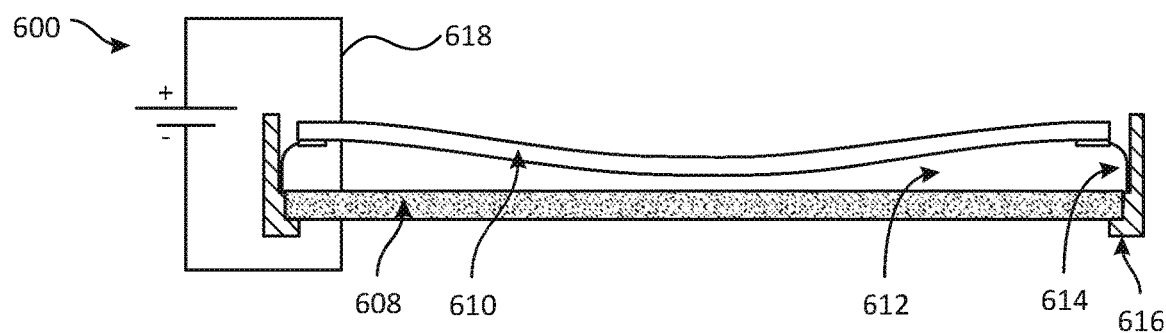

Referring to FIGS. 6A-6C, another embodiment of a deformable optical lens assembly 600 may include a support structure 608, a substantially transparent transducer 610 (e.g., including an electroactive material), a deformable medium 612, an edge seal 614, a frame 616, and a driving circuit 618. In this embodiment, the deformable medium 612 may be a compressible fluid (e.g., gas) or an incompressible fluid (e.g., a liquid). The optical lens assembly 600 may include a constrained (e.g., rigid or semi-rigid) edge seal 614 adjacent to the frame 616. The frame 616 may limit planar expansion, resulting in increased vertical (in the perspective of FIGS. 6A-6C) displacement of the transducer 610 compared to a more flexible edge seal.

In some embodiments, the edge seal 614 may allow at least some edge movement of the transducer 610 when actuated. Such a relaxation of the fixed edge boundary condition can increase deflection and enable alternative mode shapes in some embodiments, depending on the optical application. In one example, at least a portion of the transducer 610, when actuated as illustrated in FIG. 6B, may have an approximately spherical curvature. Changes in at least one optical property (e.g., optical power, wave front correction, etc.) induced by a voltage applied to the transducer 610 by the driving circuit 618 may be similar to the changes discussed above with reference to FIGS. 5A-5C. Thus, the transducer 610 may be substantially planar in a neutral, non-actuated state (FIG. 6A) with no applied voltage, a convex actuated state (FIG. 6B) with a positive applied voltage, and a concave actuated state (FIG. 6C) with a negative applied voltage.

Figure 7A:
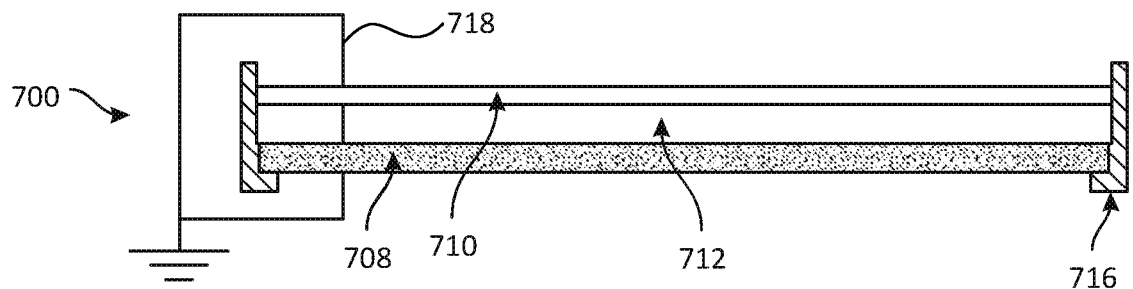
FIGS. 7A-7C are schematic cross-sectional illustrations of an optical lens assembly according to another embodiment of this disclosure, respectively in a non-actuated state, a convex actuated state, and a concave actuated state.
Figure 7B:
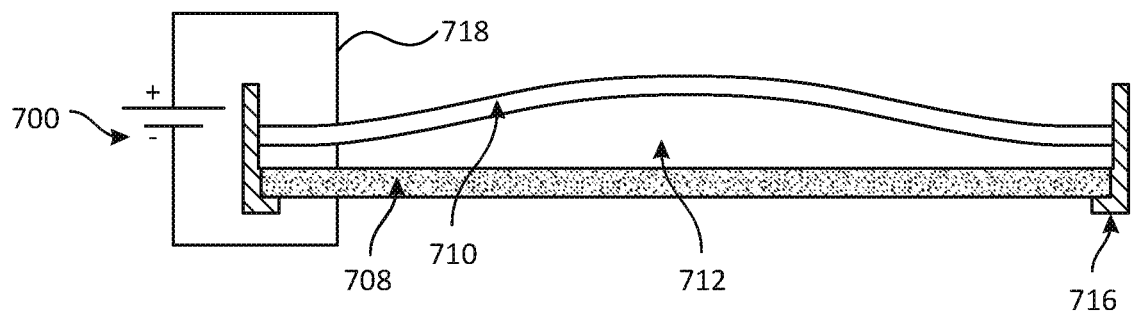
Figure 7C:
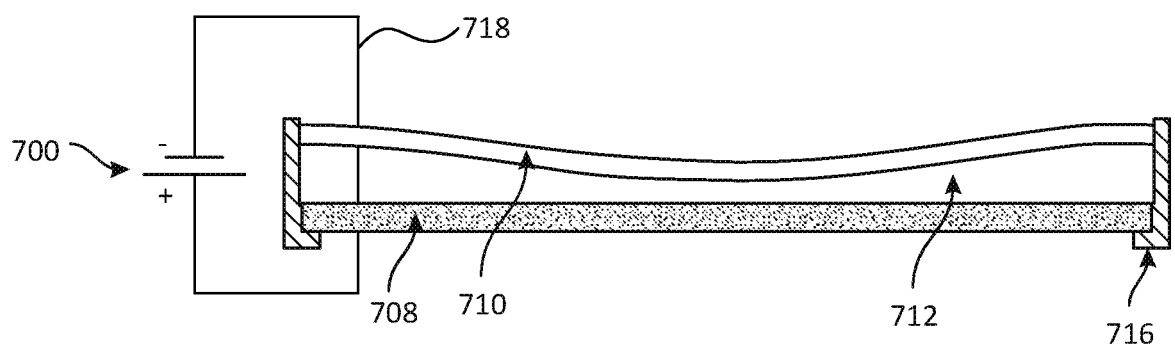

FIGS. 7A-7C show another embodiment of a deformable lens assembly 700 with a transducer 710 having an edge-constrained architecture. The deformable lens assembly 700 may include a support structure 708, a substantially transparent transducer 710 (e.g., including an electroactive material), a deformable medium 712, a frame 716, and a driving circuit 718. In some embodiments, the deformable medium 712 may be a "solid" deformable medium 712, such as a gel, a foam, or a polymer exhibiting a low elastic modulus (e.g., an elastic modulus less than about 500 kPa). In some embodiments including such solid deformable media 712, an edge seal may be omitted. Edges of the transducer 710 and deformable medium 712 may abut the frame 716, as shown in the neutral, non-actuated state in FIG. 7A, for example. The frame 716 may constrain planar expansion and movement of the transducer 710 and deformable medium 712, resulting in a roller-type boundary condition with movement resulting from actuation directed vertically (from the perspective of FIGS. 7A-7C). This may result in a vertical edge contraction under a positive applied voltage for a convex actuated state (FIG. 7B) and a vertical edge expansion under negative applied voltage for a concave actuated profile (FIG. 7C).

FIGS. 8 and 9 are example plots 800 and 900 based on the computer-modeled results of calculated deformation of deformable optical elements under different boundary conditions. Some embodiments of the present disclosure and shown in the figures illustrate examples of optical lens assemblies including a rigid or semi-rigid edge seal, but the same transduction approach can be applied for more flexible or altered edge seal designs, as discussed above. The rigidity of the edge seal may provide a boundary condition where a rigid edge might approximate a fixed boundary, a flexible edge may approximate a spring foundation, etc.

FIG. 8 illustrates calculated deflection values for a transducer including an electroactive material with full-area electrode coverage subject to a constant applied electric field, with estimated clamping fully along an edge face of the transducer. FIG. 9 illustrates calculated deflection values when only the top edge of the deformable optical element is estimated as clamped. The plots 800 and 900 of FIGS. 8 and 9 demonstrate the sensitivity of the displacement magnitude and profile on the boundary condition, and demonstrate boundary condition consideration as part of the deformable optical lens assembly design process. For example, the plot 800 of FIG. 8 (based on full edge-face clamping) shows a maximum calculated deflection of about 0.02-0.025 mm, while the plot 900 of FIG. 9 (based on only top-edge clamping) shows a higher maximum calculated deflection of about 0.09 mm. In addition, the deflection profile (e.g., shape) shown in the plot 800 of FIG. 8 demonstrates a gradual increase in deflection from an edge to a central region, while the deflection profile shown in the plot 900 of FIG. 9 demonstrates a relatively sharper increase in deflection near an edge and a relatively more planar central region.

In some embodiments, a multiple-material stack of electroactive materials may be included in a substantially transparent transducer of a deformable optical element of an optical lens assembly. The multiple-material stack of electroactive materials may include two adjacent electroactive materials. In some embodiments, an electrode material may be present between the adjacent electroactive materials. Alternating expansion and contraction induced by an applied electric field may result in deformation of the transducer. Parallel- and series-driving approaches for transducers including such multiple-material stacks of electroactive materials are respectively shown in FIGS. 10A-10C and 11A-11C.

Figure 10A:
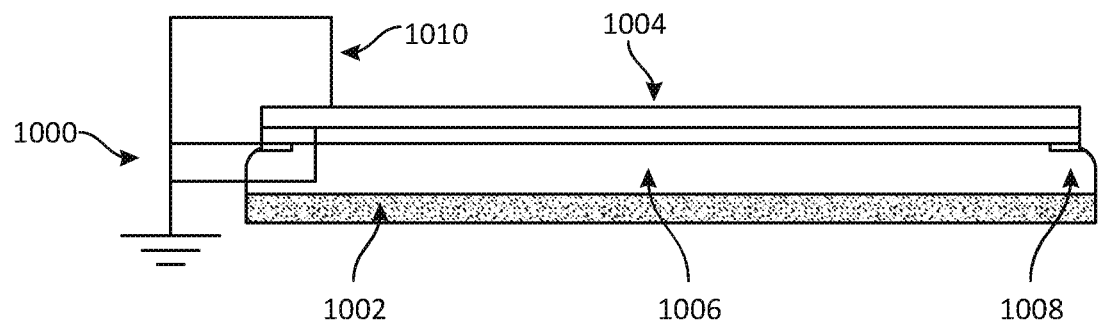
FIGS. 10A-13C are schematic cross-sectional illustrations of optical lens assemblies according to various embodiments of this disclosure, with figures ending in "A" illustrating a non-actuated state, figures ending in "B" illustrating a convex actuated state, and figures ending in "C" illustrating a concave actuated state.
Figure 10B:
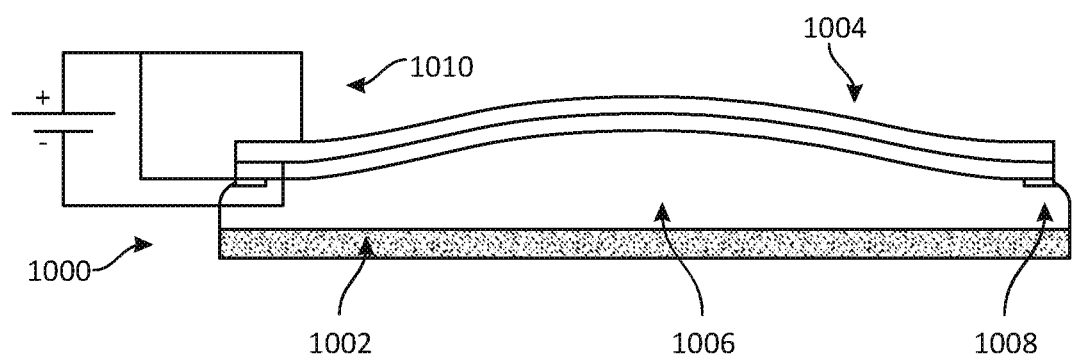
Figure 10C:
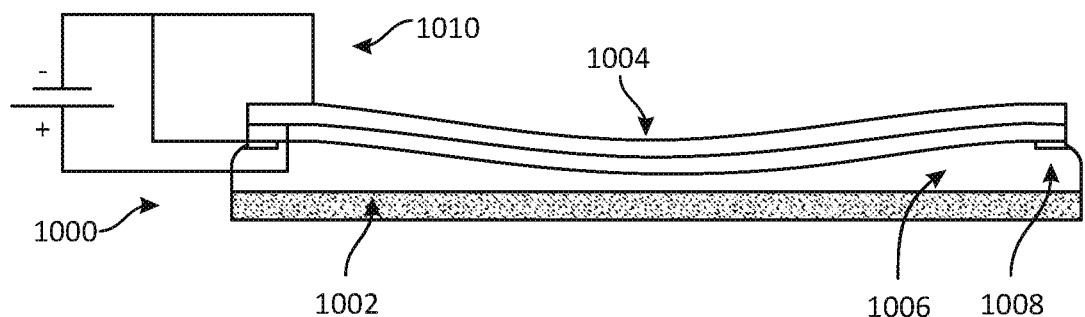

FIGS. 10A-10C show a deformable lens assembly 1000 including a support structure 1002, a multiple-material stack of electroactive materials 1004, a deformable medium 1006 between the support structure 1002 and the multiple-material stack of electroactive materials 1004, and an edge restraint 1008 (e.g., an edge seal) coupled to a peripheral edge region of the multiple-material stack of electroactive materials 1004. For simplicity, the multiple-material stack of electroactive materials 1004 is also referred to herein as a "bimorph stack 1004," referring to the two electroactive materials shown in the stack 1004. A parallel driving circuit 1010 may be used to induce deformation of the bimorph stack 1004 as desired. The bimorph stack 1004 may include a top electrode disposed over at least a portion of a top surface (from the perspective of FIGS. 10A-10C) of the bimorph stack 1004, a central electrode disposed between at least a portion of the electroactive materials of the bimorph stack 1004, and a lower electrode disposed over at least a portion of a lower surface (from the perspective of FIGS. 10A-10C) of the bimorph stack 1004. A first node of the parallel driving circuit 1010 may be coupled to the top and lower electrodes, and a second node of the parallel driving circuit 1010 may be coupled to the central electrode, as shown in FIGS. 10A-10C.

When no voltage is applied to the bimorph stack 1004, the deformable lens assembly 1000 may be in a neutral, non-actuated state, as shown in FIG. 10A. In the neutral, non-actuated state, the deformable lens assembly 1000 may, in some embodiments, be substantially planar. When a voltage is applied with the polarity shown in the parallel driving circuit 1010 of FIG. 10B (e.g., a positive node coupled to the top and lower electrodes and a negative node coupled to the central electrode), the deformable lens assembly 1000 may be in a convex actuated state. When a voltage is applied with the polarity shown in the parallel driving circuit 1010 of FIG. 10C (e.g., a negative node coupled to the top and lower electrodes and a positive node coupled to the central electrode), the deformable lens assembly 1000 may be in a concave actuated state. Alternatively, the electroactive materials of the bimorph stack 1004 may be arranged such that the voltage applied as illustrated in FIG. 10B results in a concave actuated state, and the voltage applied as illustrated in FIG. 10C results in a convex actuated state.

Examples in this disclosure include electroactive materials where transversely applied electric fields results in in-plane stress or compression, but alternative schemes are possible to induce similar deformation by, for example, in-plane electric field resulting in in-plane strain with a 33-mode piezoelectric.

Figure 11A:
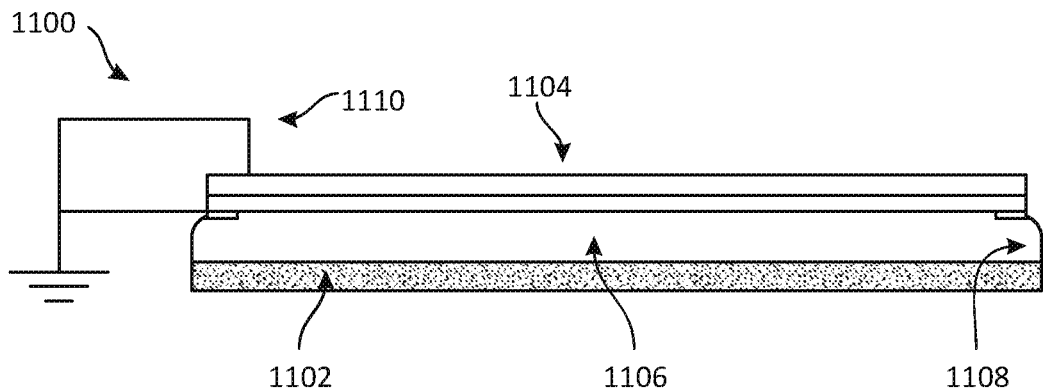
Figure 11B:
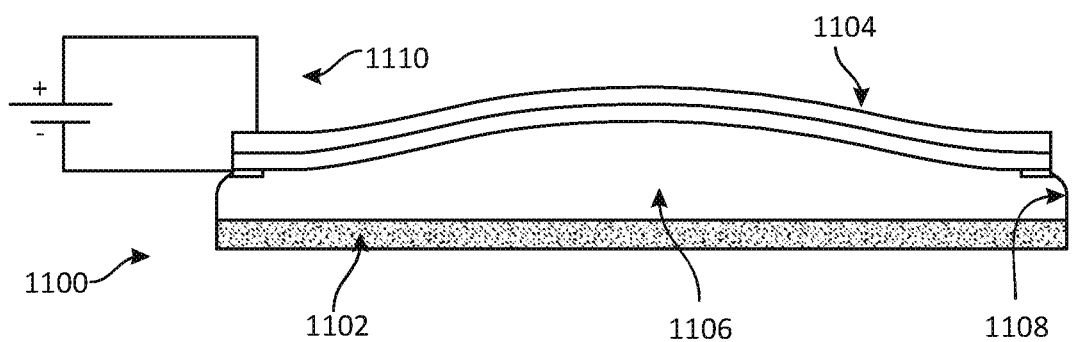
Figure 11C:
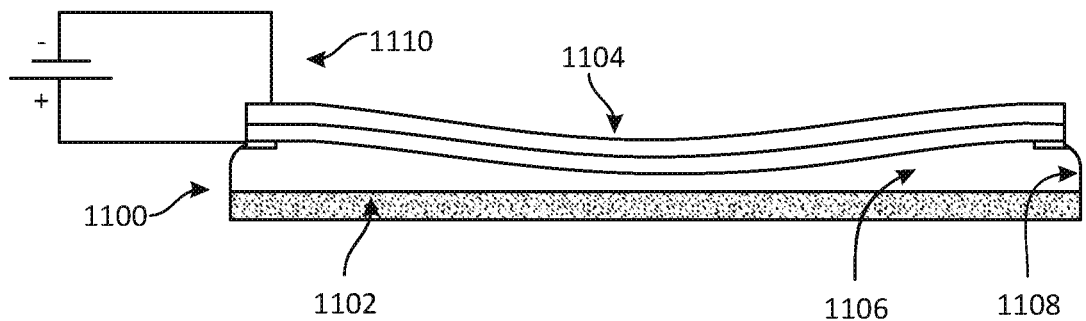

FIGS. 11A-11C show a deformable lens assembly 1100 including a support structure 1102, a multiple-material stack of electroactive materials 1104 (also referred to as a "bimorph stack 1104"), a deformable medium 1106 between the support structure 1102 and the multiple-material stack of electroactive materials 1104, an edge restraint 1108 (e.g., an edge seal), and a series driving circuit 1110. Top and lower electrodes may be disposed over top and lower (from the perspective of FIGS. 11A-11C) surfaces of the bimorph stack 1104. A central electrode that electrically couples the electroactive materials of the bimorph stack 1104 may or may not be present. The series driving circuit 1110 may be used to induce deformation of the bimorph stack 1104 as desired. In embodiments with such a series driving circuit 1110, the electroactive materials of the bimorph stack 1104 may be electrically poled in opposite directions (e.g., a top electroactive material poled in an upward direction and a bottom electroactive material poled in a downward direction) to facilitate use of the series driving circuit 1110.

When no voltage is applied to the bimorph stack 1104, the deformable lens assembly 1100 may be in a neutral, non-actuated state, as shown in FIG. 11A. In the neutral, non-actuated state, the deformable lens assembly 1100 may, in some embodiments, be substantially planar. When a voltage is applied with the polarity shown in the series driving circuit 1110 of FIG. 11B (e.g., a positive node coupled to the top electrode and a negative node coupled to the lower electrode), the deformable lens assembly 1100 may be in a convex actuated state. When a voltage is applied with the polarity shown in the series driving circuit 1110 of FIG. 11C (e.g., a negative node coupled to the top electrode and a positive node coupled to the lower electrode), the deformable lens assembly 1100 may be in a concave actuated state. Alternatively, the electroactive materials of the bimorph stack 1104 may be arranged such that the voltage applied as illustrated in FIG. 11B results in a concave actuated state, and the voltage applied as illustrated in FIG. 11C results in a convex actuated state.

By way of example and not limitation in either case shown in FIGS. 10A-11C, the electroactive material(s) of the bimorph stacks 1004, 1104 may be or include a dielectric elastomer, piezoelectric polymer, or electrostrictive polymer. Example materials that may be suitable for the electrodes are described below.

Figure 12A:
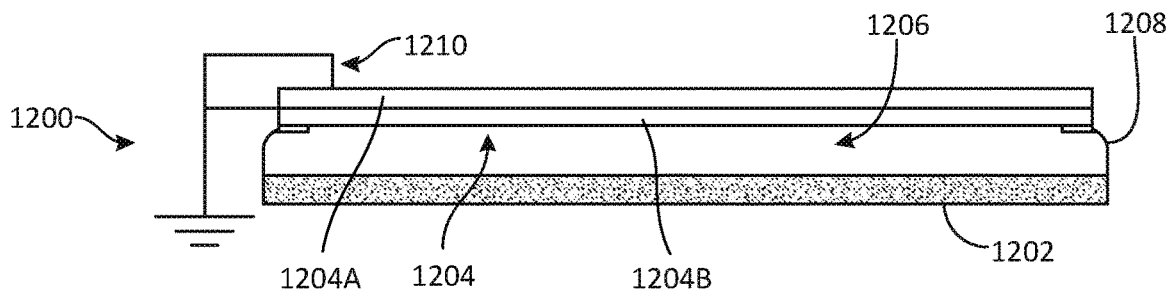
Figure 12B:
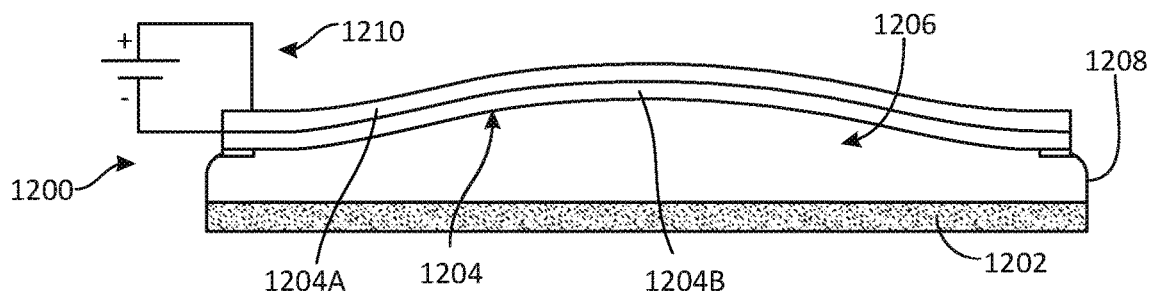
Figure 12C:
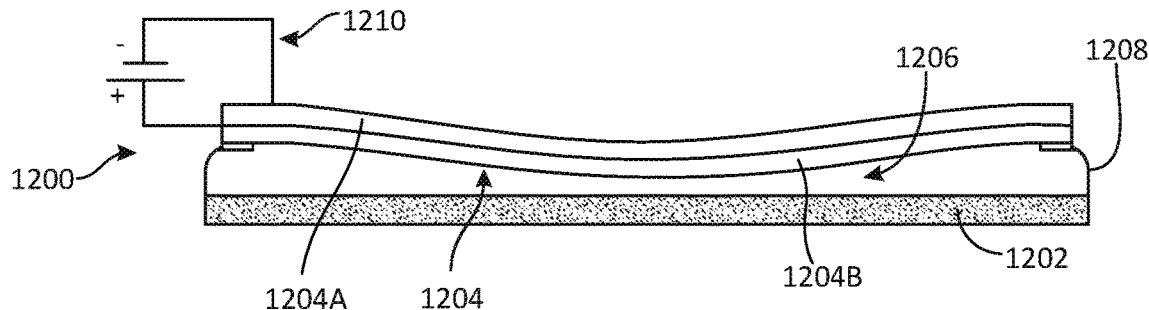

FIGS. 12A-12C show a deformable lens assembly 1200 in a neutral, non-actuated state (FIG. 12A), a convex actuated state (FIG. 12B), and a concave actuated state (FIG. 12C). As an alternative to the bimorph stacks 1004, 1104 described above, an electroactive material 1204A may be fixed to a relatively more rigid passive support 1204B material to form an electroactive stack 1204, as shown in a deformable lens assembly 1200 of FIGS. 12A-12C. Such an electroactive stack 1204 is also referred to herein as a "unimorph stack 1204," referring to the single electroactive material element in the electroactive stack 1204. The deformable lens assembly 1200 of FIGS. 12A-12C may include a support structure 1202, the unimorph stack 1204, a deformable medium 1206 between the support structure 1202 and the unimorph stack 1204, an edge restraint 1208 (e.g., an edge seal), and a driving circuit 1210.

For comparable electroactive materials, bimorph stack configurations may, in some examples, be more mechanically efficient than the unimorph stack 1204, since some energy may be directed to deforming the passive material in the unimorph stack 1204 upon actuation. However, the unimorph stack 1204 may be suitable for some applications. For example, for electroactive polymer materials that are less stiff than piezoceramics, the unimorph stack 1204 including the electroactive material 1204A and the relatively more rigid passive support 1204B may be employed to increase a stiffness of the overall unimorph stack 1204, which may be advantageous for certain applications where relatively low displacement and/or relatively high load tolerance is desired. The driving circuit 1210 may be coupled to the electroactive material 1204A to apply a voltage for actuation. The electroactive material(s) 1204A in the unimorph stack 1204 may be or include a dielectric elastomer, a piezoelectric polymer, or an electrostrictive polymer, for example.

Figure 13A:
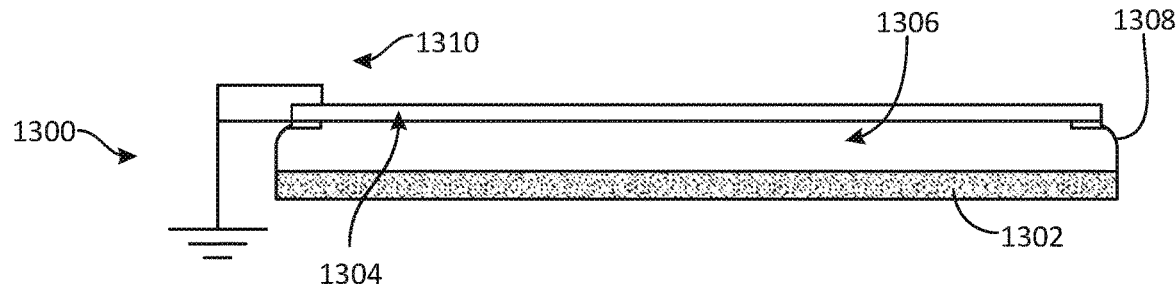
Figure 13B:
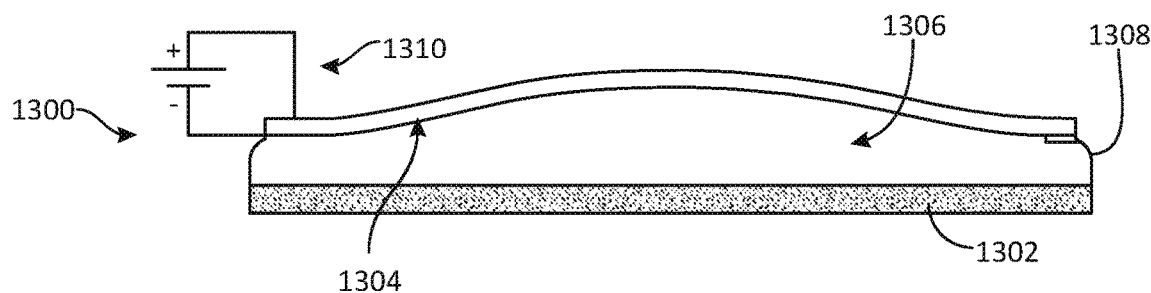
Figure 13C:
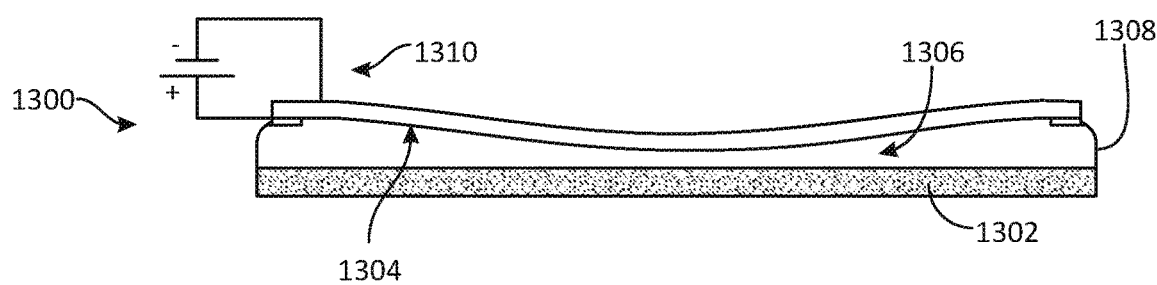

FIGS. 13A-13C illustrate a deformable lens assembly 1300 in a neutral, non-actuated state (FIG. 13A), a convex actuated state (FIG. 13B), and a concave actuated state (FIG. 13C). The deformable lens assembly 1300 may include a support structure 1302, a transducer 1304 that includes a dielectric elastomeric capacitor, a deformable medium 1306, an edge restraint 1308 (e.g., an edge seal), and a driving circuit 1310. In some examples, the term "capacitor" may refer to an architecture for dielectric elastomer actuators where the structure includes a dielectric elastomer between two electrodes. The transducer 1304 may expand or contract depending on a polarity of an applied voltage from the driving circuit 1310, to result in a change in curvature to vary optical power. With each additional material added to the transducer 1304, optical transmittance and clarity may be incrementally reduced, in some examples. Therefore, since only three layers of material (e.g., a dielectric elastomer and two electrodes) are employed in the transducer 1304, the capacitor structure may be optically advantageous and structurally simple, in some embodiments. For some dielectric elastomers, a pre-strain may be used to improve an electromechanical response thereof and reduce gravity sag, for example.

Figure 14:
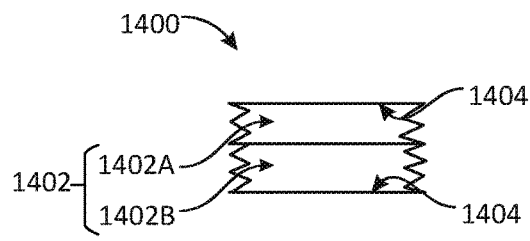
FIGS. 14-18 are partial cross-sectional views of substantially transparent transducers according to several embodiments of this disclosure.

FIG. 14 illustrates a detailed view of a bimorph stack 1400 transducer that includes a first electroactive material 1402A adjacent to a second electroactive material 1402B (collectively, the electroactive materials 1402), with conductive electrodes 1404 on opposing surfaces of the electroactive materials 1402. Optionally, such as depending on a configuration of a corresponding driving circuit, a central electrode may be disposed between the first electroactive material 1402A and the second electroactive material 1402B.

Figure 15:
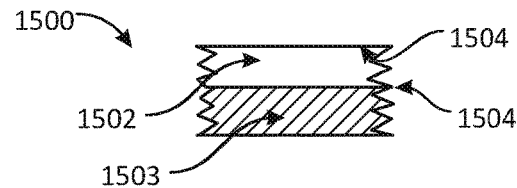

FIG. 15 illustrates a detailed view of a unimorph stack 1500 transducer that includes an electroactive material 1502 adjacent to a passive (e.g., electrically insulative) support 1503, with conductive electrodes 1504 on opposing surfaces of the electroactive material 1502.

Figure 16:
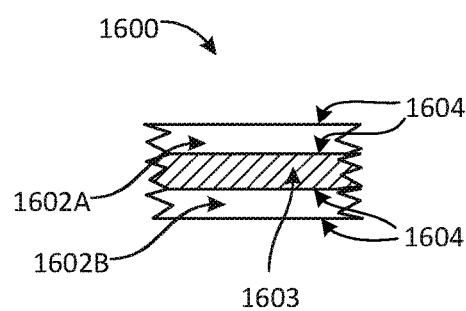

FIG. 16 illustrates a detailed view of a so-called "multi-morph" stack 1600 transducer, referring to the two or more materials in the stack 1600. The multi-morph stack 1600 may include a first electroactive material 1602A and a second electroactive material 1602B, with a central core of a relatively higher-stiffness passive material 1603 positioned between the electroactive materials 1602A and 1602B. Electrodes 1604 may be positioned on opposing surfaces of each of the electroactive materials 1602A and 1602B for actuating and deforming the multi-morph stack 1600.

Figure 17:
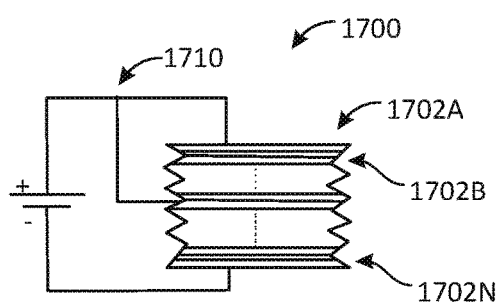

Referring to FIG. 17, a stack of multiple electroactive materials 1700 (also referred to as a "multi-morph stack" 1700) may include a plurality of adjacent electroactive materials 1702A, 1702B, . . . 1702N. The polarity of a voltage applied by a driving circuit 1710 (e.g., a parallel driving circuit) may be alternated between the electroactive materials 1702A, 1702B, . . . 1702N of the multi-morph stack 1700, resulting in, during actuation, bending and expansion in the multi-morph stack 1700 behaving like a relatively thicker bulk single-material design, such as the embodiment described above with reference to FIG. 14, for example. For electroactive materials, induced stress scales with electric field linearly in piezoelectrics and quadratically in electrostrictive materials and dielectric elastomers. A relatively large electromechanical response may therefore be achieved by applying a high electric field, which results in a relatively high voltage across thicker films. To this end, unimorph and bimorph structures, such as those described above, including electroactive polymers may require a relatively high voltage for actuation. The design illustrated in FIG. 17, which includes multiple relatively thinner electroactive materials 1702A, 1702B, . . . 1702N, may require a lower voltage relative to the unimorph and bimorph structures described above for achieving a similar electric field. In operation, the structure of the multi-morph stack 1700 may result in an actuation volume, and thus output energy, that is akin to bulk systems such as the unimorph and bimorph structures discussed above. However, relatively thinner electroactive materials 1702A, 1702B, . . . 1702N may result in higher capacitance, which may or may not be desirable depending on the application.

Figure 18:
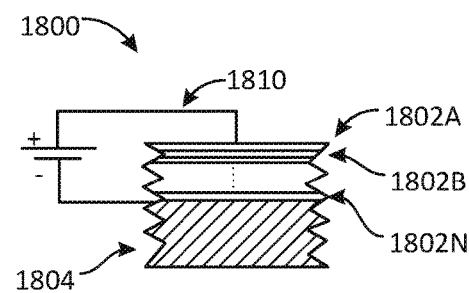

FIG. 18 illustrates an embodiment of a multi-morph stack 1800 that includes a plurality of adjacent electroactive materials 1802A, 1802B, . . . 1802N positioned over a passive support 1804. The multi-morph stack 1800 may be actuated by a driving circuit 1810 (e.g., a series driving circuit), and may function similarly to the bimorph stack 1500 described above with reference to FIG. 15.

In any of the embodiments described herein, a thickness of the electroactive material(s) may vary depending on the design, stiffness, particular materials, intended application, etc. By way of example and not limitation, an overall thickness of the electroactive material(s) and/or passive support material (if any) may be between about 20 μm and about 200 μm.

The approaches outlined above are described and shown in the figures with reference to electroactive materials of uniform thickness and types, which may result in a deflection profile limited to a mode shape based on a level of tension in the electroactive material(s) and/or any passive material, and based on rigidity of the electroactive material(s) and/or any passive material. For an axisymmetric multi-material stack in which the tension dominates over rigidity, a deflection profile that roughly scales quadratically with the radial coordinate may be attained. Conversely, when rigidity dominates, the deflection profile may scale with the radial coordinate to the fourth power. Each of these potential deflection profiles varies from a spherical or aspherical profile that may be intended for some applications to achieve low-aberration, distortion-free optical performance. For asymmetric shapes, such as for HMD lenses in a shape appropriate for eyeglasses (e.g., AR eyeglasses), the deflection profile may also be asymmetric, which may introduce astigmatic and other optical errors in some instances.

The transducer (e.g., a unimorph, bimorph, multi-morph, capacitor, or other electroactive material(s)) may be formed or actuated with non-uniformity to realize a substantially aspherical or other desired deformation profile. For example, including a variable applied electric field, variable stiffness, variable tension, variable thickness, variable material, etc. may introduce a desired non-uniformity. An example to achieve a non-uniform electric field may include patterned electrodes, such as in the form of radial fingers, circular ring electrodes, non-circular ring electrodes, other shapes, or combinations thereof.

FIG. 19 illustrates an axisymmetric clamped PVDF bimorph stack 1900 of electroactive materials 1902A and 1902B including ring electrodes 1904 disposed on opposing surfaces of the electroactive materials 1902A and 1902B along a peripheral edge thereof. The ring electrodes 1904 may each have a thickness of $h_p$, as shown in FIG. 19. In FIG. 19, a radial coordinate on the bimorph stack 1900 is illustrated as a, and an internal electrode radius is illustrated as ai. A difference between the external radius of the ring electrode 1904 and the internal radius ai of the ring electrode 1904 is referred to herein as a "lateral width" of the ring electrode 1904. In FIG. 19, an axial deflection at a center of the electroactive materials 1902A and 1902B is shown as w(0), and axial deflections at different radial coordinates along the electroactive materials 1902A and 1902B are identified as w. In one example, the bimorph 1900 may be actuated by a driving circuit 1910 (e.g., a series driving circuit).

For purposes of illustration, FIGS. 20 and 21 are respective plots 2000 and 2100 showing calculated deflection profiles of the bimorph stack 1900 of FIG. 19 at various dimensions. FIG. 20 shows the effect of varying the thickness $h_p$ (between 0.05 mm and 0.2 mm) and the lateral width of the ring electrode 1904 (shown as the ratio aim. FIG. 21 shows the effect of varying the lateral width of the ring electrode 1904 by plotting the ratio of axial displacement (w) at various radial coordinates to maximum axial displacement (w(0)) at the center of the bimorph stack 1900 for a number of different internal electrode radii ai, from 2 mm to 22 mm. In the example used for producing the plots 2000 and 2100, the outer radius of the bimorph stack 1900 and of the ring electrode 1904 is about 25 mm.

The bimorph stack 1900, including the ring electrode 1904, is estimated to have modified deflection profiles for various ring widths of the ring electrode 1904 and for various electrode thicknesses $h_p$ compared to the uniform electrode coverage case (the uniform electrode coverage being illustrated by the leftmost points in the plot 2000 of FIG. 20, where the ratio of ai/a is zero). In this example, at any of the electrode thicknesses analyzed, it was calculated that a maximum deflection may be obtained by providing the ring electrode 1904 with a lateral width ratio (ai/a) of between about 0.5 and about 0.6. Additionally, for a given shape of the ring electrode 1904, a lower thickness $h_p$ may result in greater deflection upon actuation.

Tunable deflection amplitude and profile can also be achieved through variation in the size and geometry of the ring as demonstrated in the normalized deflection profiles shown in the plot 2100 of FIG. 21. A size and physical configuration of the ring electrode 1902 can be modified to result in different displacements, to tailor a deflection profile of the bimorph stack 1900. For example, the ring electrode 1902 with a relatively small lateral width may result in a larger central displacement compared to an electrode fully covering the bimorph stack 1900, or compared to a ring electrode 1902 having a relatively larger lateral width covering a larger area of the bimorph stack 1900.

For an optical lens assembly that is asymmetric in shape, the electrode patterning concept just described can improve deflection magnitude, realize a more desirable profile that is largely axisymmetric, and tune an optical center to a pupil of the user. An example plot 2200 showing calculated deflection values of a fully clamped, PVDF bimorph stack with a ring electrode is shown in FIG. 22, and can be compared to a uniform electrode case presented above in relation to FIG. 8. The dashed lines in FIG. 22 indicate areas where a positive voltage V and a negative voltage −V are applied.

FIG. 23 shows a detailed view of a transducer 2300 including a multi-morph stack having two adjacent electroactive materials 2302 separated by a passive support 2303 (e.g., a glass core). For optical uniformity, a material of the passive support 2303 may be selected to exhibit a substantially similar index of refraction as the electroactive materials 2302. A plot 2400 of FIG. 24 illustrates calculated deflection values for the transducer 2300 of FIG. 23. The plot 2400 of FIG. 24 is similar to the plot 2200 of FIG. 22, but increased stiffness imparted to the transducer 2300 by the glass core 2303 reduces a magnitude of the deflection compared to the plot 2200 of FIG. 22, as may be noted by observing the scales shown in FIGS. 22 and 24. The dashed lines in FIG. 24 indicate areas where a positive voltage V and a negative voltage −V are applied.

FIG. 25A is a plot 2502 showing optical transmittance ("T") properties of certain materials at different sheet resistance levels. FIG. 25B is a plot 2504 showing stretchability properties of the materials at normalized resistances. The materials analyzed in FIGS. 25A and 25B are potentially suitable electrode materials for transducers according to different embodiments of optical lens assemblies of the present disclosure. The materials may be configured as substantially transparent electrodes. The analyzed materials include silver nanowires ("AgNWs"), single-walled carbon nanotubes ("SWNTs"), indium tin oxide ("ITO"), hydrogel, and graphene. For the range of displacements required to achieve the necessary optical power shift for accommodation, strain during operation may be limited to less than approximately 1%. However, for improved electromechanical performance and/or the mitigation of gravity sag, pre-strain on the order of 10% or more may be desired, in some examples. The conducting electrode material may be selected to improve optical clarity and transparency for a stretchability requirement of a given application. Alternatively, if pre-strain is required for the design, a substantially transparent electrode material may be deposited onto pre-tensioned electroactive material(s) to reduce a strain imposed on the electrode material during actuation. Accordingly, the plots 2502 and 2504 of FIGS. 25A and 25B may provide information to assist in the selection of an appropriate electrode material for a given application.

Substantially transparent conductors appropriate for application as electrodes for deformable lenses can be roughly divided into example categories of inorganic films, such as substantially transparent conducting oxides ("TCOs"), including indium tin oxide ("ITO"); nanocomposites based on nanomaterials like carbon nanotubes ("CNTs") and silver nanowires ("AgNW"); and two-dimensional ("2D") materials including graphene.

FIGS. 10A-24 were described above with reference to embodiments including electroactive polymer materials in the transducers. However, any of the embodiments described and shown above, including but not limited to with reference to FIGS. 10A-24, may alternatively or additionally include one or more high-modulus materials as electroactive materials. In some examples, the term "high modulus" may refer to an elastic modulus greater than 5 GPa. By way of example and not limitation, high modulus materials may include certain composites, ceramics, minerals, etc. that exhibit an elastic modulus greater than 5 GPa.

For example, single-crystal electroactive materials may exhibit a larger electromechanical response from improved domain alignment compared to polycrystalline materials. Also, a reduction of defects or grain boundaries in a single-crystal electroactive material can lead to relatively high optical clarity compared to polycrystalline materials. As noted above, example single crystal materials for transducers of optical lens assemblies include KNN, barium titanate, lithium niobate, lithium tetraborate, quartz, PMN-PT, PZN-PT, etc. Although these materials can be relatively stiff in bulk form, when sufficiently thinned and incorporated into a deformable optical element, deformation large enough to achieve an observable optical power shift is possible, as illustrated in the plots 2600 and 2700 respectively shown in FIGS. 26 and 27.

In particular, the plots 2600 of FIG. 26 and 2700 of FIG. 27 show calculated deflection values of a lithium niobate bimorph stack with full-area electrode coverage subject to a constant applied electric field. The plot 2600 of FIG. 26 shows the deflection with clamping fully along the edge face of the bimorph stack, and the plot 2700 of FIG. 27 shows the deflection when only the top edge is clamped. The plots 2600 and 2700 demonstrate the sensitivity of the displacement magnitude and profile on the boundary condition, and demonstrate boundary condition consideration as part of the deformable lens design process. In addition, FIGS. 26 and 27 can be respectively compared with FIGS. 8 and 9 to identify differences in deflection profiles (e.g., magnitudes and shapes) for high-modulus electroactive materials (FIGS. 26 and 27) and electroactive polymer materials (FIGS. 8 and 9).

FIG. 28 illustrates a plot 2800 of calculated deflection values of an optical lens assembly similar to the plots 2200 and 2400 illustrated in FIGS. 22 and 24, but in which a ring electrode is employed, rather than a full-area electrode. The plot 2800 of FIG. 28 was generated based on an electroactive material including lithium niobate. The dashed lines in FIG. 28 indicate areas where a positive voltage V and a negative voltage -V are applied.

FIG. 29 shows a plot 2900 of visible transmittance ("VT") of conductors with potential as material for a substantially transparent electrode according to the present disclosure. Example electrode materials include metals, ITO, silver nanowires ("AgNWs"), carbon nanotubes ("SWNT5"), graphene, and poly(3,4-ethylenedioxythiophene) polystyrene sulfonate ("PEDOT:PSS").

FIG. 30 is a flow diagram of an example method 3000 of fabricating an optical lens assembly. As illustrated in operation 3010, a deformable optical element may be formed to include a substantially transparent transducer that is at least partially positioned within a transparent optical aperture of the optical lens assembly. The transducer may be configured to deform, and thus change at least one optical property of, the deformable optical element. In operation 3020, a driving circuit may be coupled to the transducer for actuating and deforming the transducer. In operation 3030, the transducer may be coupled to a support structure, such as an optical lens and/or a substantially transparent protective covering. The transducer may be directly coupled (e.g., via an adhesive or mechanical bond) to the support structure, or indirectly coupled (e.g., with an edge restrainer, edge seal, or deformable medium). In some embodiments, a deformable medium may be disposed between the support structure and the transducer. In operation 3040, the transducer and support structure may be coupled to a frame, such as a frame of a head-mounted display or eyeglasses.

Formation of substantially transparent inorganic materials (e.g., for electroactive materials of transducers of deformable optical elements) may be accomplished by, for example, physical vapor deposition ("PVD") methods including sputtering and evaporation, as will be understood by those skilled in the art of fabricating transparent inorganic materials. Evaporative techniques can be used to form nanocomposite materials from solvent-based solutions of nanomaterial(s). 2D materials like graphene may be formed by transfer processing, for example.

Electroactive polymers, such as for the substantially transparent transducers disclosed herein, may be formed by, for example, using evaporative techniques with solvent precursors to produce solvent-cast films exhibiting sufficient optical quality for some applications. For piezoelectric polymers like PVDF, orientation may be controlled via uniaxial or biaxial stretching, followed by electrical poling to set the piezoelectric response. Other piezoelectric polymers including PVDF-TrFE may be oriented when formed, then electrically poled.

Co-extrusion may provide an option for direct manufacture of some of the electroactive material(s) of the substantially transparent transducers of the present disclosure. A high drawing ratio may make many thin layers, such as those compatible with a multi-morph architecture, possible from a larger billet of conductive, electroactive, and/or passive support materials. Electroactive materials may also be extruded individually and may be a more appropriate option if manufacture of the conductive materials is incompatible (e.g., due to mechanical or chemical properties) with an extrusion-type process. This may be the case if a 2D material or PVD-deposited inorganic film is used as the electrode material.

Single-crystal electroactive materials may be formed via a growth process, such as the so-called "Czochralski process," or hydrothermal synthesis to produce an oriented ingot. Since a piezoelectric response may be directionally dependent, the resulting ingot may be cut along a specified plane corresponding to a desired crystal orientation. Once cut, the crystal can be thinned, such as via lapping, fracturing, and/or polishing, and substantially transparent electrodes such as substantially transparent conductive oxides ("TCOs") including ITO can be deposited directly onto the single crystal electroactive material substrate via chemical vapor deposition ("CVD") or PVD, such as sputtering or evaporation. With the deposited electrode(s), the electroactive material can then be electrically poled for dipole alignment. If additional passive, active, or conductive layers are desired in the assembly, the electroactive material with the deposited electrode(s) can be bonded to other materials to form a stack.

As detailed above, embodiments of the present disclosure include optical lens assemblies and head-mounted displays that include a substantially transparent transducer that may be at least partially located within an optical aperture of the optical lens assemblies. The transducers may include an electroactive material configured to, upon actuation, deform at least one deformable optical element to alter an optical property of the optical lens assemblies.

Embodiments of the instant disclosure may include or be implemented in conjunction with an artificial reality system. Artificial reality is a form of reality that has been adjusted in some manner before presentation to a user, which may include, e.g., a virtual reality ("VR"), an augmented reality ("AR"), a mixed reality ("MR"), a hybrid reality, or some combination and/or derivatives thereof. Artificial reality content may include completely generated content or generated content combined with captured (e.g., real-world) content. The artificial reality content may include video, audio, haptic feedback, or some combination thereof, any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including an HMD connected to a host computer system, a standalone HMD, a mobile device or computing system, or any other hardware platform capable of providing artificial reality content to one or more viewers.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various example methods described and/or illustrated herein may also omit one or more of the steps described or illustrated herein or include additional steps in addition to those disclosed.

The preceding description has been provided to enable others skilled in the art to best utilize various aspects of the example embodiments disclosed herein. This example description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. An optical lens assembly, comprising:
   a deformable optical element comprising a substantially transparent transducer configured to deform, and thus change at least one optical property of, the deformable optical element;
   wherein at least a portion of the substantially transparent transducer is positioned within a substantially transparent optical aperture of the optical lens assembly; and
   wherein the substantially transparent transducer comprises:
      a first electroactive material comprising a piezoelectric polymer including at least one of polyvinylidene fluoride or a copolymer of polyvinylidene fluoride;
      a second electroactive material stacked over the first electroactive material; and
      an electromechanical element.

2. The optical lens assembly of claim 1, wherein the substantially transparent optical aperture allows passage of light to a user's eye.

3. The optical lens assembly of claim 1, wherein at least one of the optical lens assembly or the deformable optical element has a non-symmetric shape.

4. The optical lens assembly of claim 1, wherein the first electroactive material further comprises at least one of a piezoelectric ceramic or an electrostrictor ceramic.

5. The optical lens assembly of claim 4, wherein the first electroactive material comprises a polycrystalline ceramic material.

6. The optical lens assembly of claim 5, wherein the polycrystalline ceramic material includes a dopant.

7. The optical lens assembly of claim 4, wherein the first electroactive material has a perovskite-type crystallography.

8. The optical lens assembly of claim 1, wherein the first electroactive material further comprises a single-crystal material.

9. The optical lens assembly of claim 8, wherein the single-crystal material comprises at least one of $K_{0.5}Na_{0.5}NbO_3$, barium titanate, lithium niobate, lithium tetraborate, quartz, $Pb(Mg_{1/3}Nb_{2/3})O_3$—$PbTiO_3$, or $Pb(Zn_{1/3}Nb_{2/3})O_3$—$PbTiO_3$.

10. The optical lens assembly of claim 1, wherein the substantially transparent transducer further comprises at least one substantially transparent electrode configured to activate the first electroactive material by application of an electrical voltage thereto.

11. The optical lens assembly of claim 10, wherein the at least one substantially transparent electrode comprises at least one of: a transparent conducting oxide, indium tin oxide, a nanocomposite material, carbon nanotubes, silver nanowires, or graphene.

12. An optical lens assembly, comprising:
   a deformable optical element comprising a substantially transparent transducer configured to deform, and thus change at least one optical property of, the deformable optical element;
   wherein at least a portion of the substantially transparent transducer is positioned within a substantially transparent optical aperture of the optical lens assembly; and
   wherein the substantially transparent transducer comprises a first electroactive material including an electroactive polymer comprising at least one of: an electrostrictor polymer, a dielectric elastomer, or an ionic polymer conductor, and a second electroactive material stacked over the first electroactive material.

13. The optical lens assembly of claim 12, wherein the substantially transparent transducer comprises:
a first surface and an opposing second surface; and
a first electrode electrically coupled to the first surface and a second electrode electrically coupled to the second surface.

14. The optical lens assembly of claim 13, further comprising a driving circuit electrically coupled to the first electrode and the second electrode.

15. The optical lens assembly of 12, further comprising a structural support element to which the deformable optical element is coupled, the structural support element comprising a substantially zero optical power lens or a substantially non-zero optical power lens.

16. The optical lens assembly of claim 12, wherein the deformable optical element further comprises a deformable medium comprising at least one of a liquid, a gas, a gel, a foam, or a polymer.

17. An optical lens assembly, comprising:
a deformable optical element comprising a substantially transparent transducer configured to deform, and thus change at least one optical property of, the deformable optical element;
wherein at least a portion of the substantially transparent transducer is positioned within a substantially transparent optical aperture of the optical lens assembly; and
wherein the substantially transparent transducer comprises at least two electroactive materials in a stack.

18. The optical lens assembly of claim 17, wherein:
the two electroactive materials comprise more than two electroactive materials; and
the optical lens assembly further comprises a series driving circuit or a parallel driving circuit electrically coupled to the more than two electroactive materials.

19. The optical lens assembly of claim 17, wherein the at least two electroactive materials are coupled to at least one electrically passive support material.

20. The optical lens assembly of claim 17, wherein the at least two electroactive materials comprise a first electroactive material and a second electroactive material, further comprising an electrode material positioned between the first electroactive material and the second electroactive material.

* * * * *